(12) United States Patent
Peng et al.

(10) Patent No.: US 11,764,756 B2
(45) Date of Patent: Sep. 19, 2023

(54) CRYSTAL DEVICE AND METHOD FOR MANUFACTURING CRYSTAL DEVICE

(71) Applicant: TAI-SAW Technology Co., Ltd., Taoyuan (TW)

(72) Inventors: Cheng-Kang Peng, Taoyuan (TW); Kun-Yu Huang, Taoyuan (TW); Chi-Yun Chen, Taoyuan (TW); Song Tian, Wuxi (CN); Tsung-Pin Yang, Taoyuan (TW)

(73) Assignee: TAI-SAW TECHNOLOGY CO., LTD., Taoyuan (TW)

( * ) Notice: Subject to any disclaimer, the term of this patent is extended or adjusted under 35 U.S.C. 154(b) by 346 days.

(21) Appl. No.: 17/329,788

(22) Filed: May 25, 2021

(65) Prior Publication Data
US 2021/0384888 A1   Dec. 9, 2021

(30) Foreign Application Priority Data

Jun. 5, 2020   (CN) .......................... 202010505592.8
Mar. 15, 2021  (TW) ................................. 110109203

(51) Int. Cl.
*H03H 9/24*   (2006.01)
*C09J 9/02*   (2006.01)
*H03H 3/007*  (2006.01)

(52) U.S. Cl.
CPC .................. *H03H 9/24* (2013.01); *C09J 9/02* (2013.01); *H03H 3/007* (2013.01)

(58) Field of Classification Search
CPC ............ H03H 9/24; H03H 3/00; H03H 3/007; H03H 3/0072; H03H 2003/0071; C09J 9/00; H10N 30/872
USPC .................................................. 327/564, 565
See application file for complete search history.

(56) References Cited

U.S. PATENT DOCUMENTS

| 10,217,765 B2* | 2/2019 | Kanno ............. H01L 23/49838 |
| 2022/0294419 A1* | 9/2022 | Rau .......................... H03H 9/19 |

* cited by examiner

*Primary Examiner* — Hai L Nguyen
(74) *Attorney, Agent, or Firm* — Volpe Koenig

(57) ABSTRACT

A crystal device includes a bearing base, an integrated chip and a conductive adhesive unit. The bearing base includes a conductive seat. The integrated chip includes a principal reference plane facing the conductive seat, and having a first major axis. The conductive adhesive unit has a second major axis and an aspect ratio, and is at least partly disposed between the conductive seat and the integrated chip. The aspect ratio ranges from 1.1 to 1.9. The principal reference plane further has a perpendicular projection straight line defined according to the second major axis. A practical angle is included by the first perpendicular projection straight line and the first major axis, and ranges from 0 degree to 90 degrees.

20 Claims, 27 Drawing Sheets

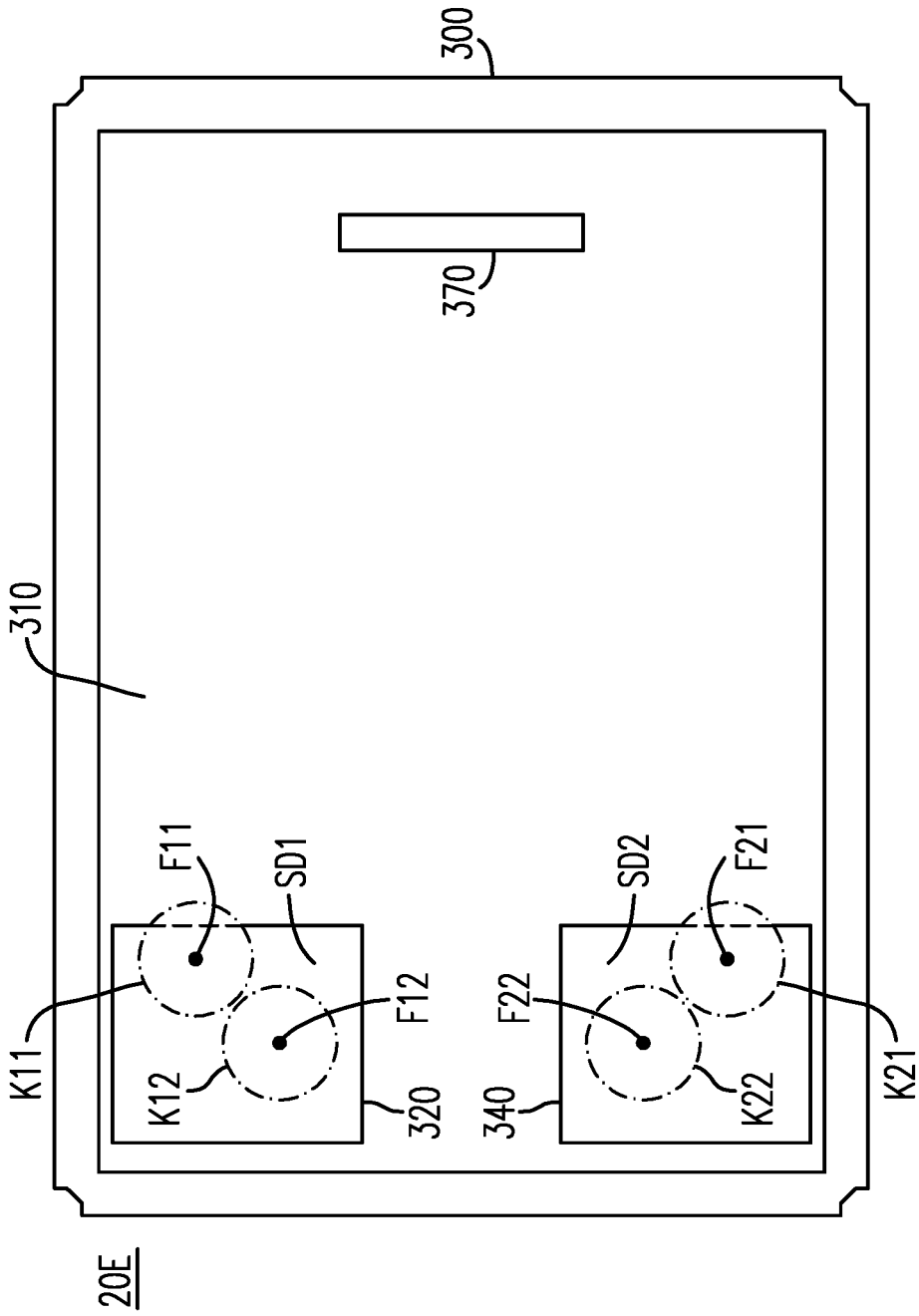

CRYSTAL DEVICE AND METHOD FOR MANUFACTURING CRYSTAL DEVICE

CROSS-REFERENCE TO RELATED APPLICATION AND CLAIM OF PRIORITY

The application claims the benefit of China Patent Application No. 202010505592.8, filed on Jun. 5, 2020, at the State Intellectual Property Office of China, and the benefit of Taiwan Patent Application No. 110109203, filed on Mar. 15, 2021, at the Taiwan Intellectual Property Office, the disclosures of which are incorporated herein in their entirety by reference.

TECHNICAL FIELD

The present disclosure is related to a crystal device and, more particularly, is related to a crystal device having a conductive adhesive and an integrated chip, and a manufacturing method thereof.

BACKGROUND

Please refer to FIG. 1A and FIG. 1B. FIG. 1A is a schematic diagram showing a top view of a crystal device 100 in the prior art. FIG. 1B is a schematic diagram showing a front view of the crystal device 100 shown in FIG. 1A. As shown in FIGS. 1A and 1B, the crystal device 100 includes a bearing base 300, an integrated chip 400, a conductive hardened adhesive W71, a conductive hardened adhesive W81 and a lid 500. The bearing base 300 has a containment space VC1, and includes an insulation base body 310, a first conductive seat 320, and a second conductive seat 340 being opposite to the first conductive seat 320. The insulation base body 310 is a ceramic base body, and is coupled to the first and the second conductive seats 320 and 340. Each of the integrated chip 400, the conductive hardened adhesive W71 and the conductive hardened adhesive W81 is disposed in the containment space VC1. The lid 500 is disposed on the bearing base 300, and is used to insulate the containment space VC1 from the external environment and to seal the bearing base 300.

The integrated chip 400 includes a crystal chip 410, a first excitation electrode 430, a second excitation electrode 450 being opposite to the first excitation electrode 430, a first extension electrode 440 extending from the first excitation electrode 430, and a second extension electrode 460 extending from the second excitation electrode 450. The conductive hardened adhesive W71 is at least partly disposed between the first conductive seat 320 and the first extension electrode 440. The conductive hardened adhesive W81 is at least partly disposed between the second conductive seat 340 and the second extension electrode 460. The crystal device 100 is used to form an electrical signal. The insulation base body 310 is used to install the first and the second conductive seats 320 and 340 to cause the bearing base 300 to have a signal contact point for the electrical signal.

The conductive hardened adhesives W71 and W81 are respectively disposed on the first and the second conductive seats 320 and 340. The crystal chip 410 is a quartz chip, and is used to form a frequency signal source. Each of the conductive hardened adhesives W71 and W81 is disposed between the integrated chip 400 and the bearing base 300, serves as a signal transmission medium, and serves as a fixing support point. The first and the second excitation electrodes 430 and 450 are used to excite the crystal chip 410 to oscillate in response to a voltage to generate a signal having a frequency. The first extension electrode 440 is used to connect the first excitation electrode 430 with the conductive hardened adhesive W71. The second extension electrode 460 is used to connect the second excitation electrode 450 with the conductive hardened adhesive W81. The first and the second excitation electrodes 430 and 450 are respectively made of a first metal material and a second metal material.

The single conductive hardened adhesive W71 disposed on the first conductive seat 320 and the single conductive hardened adhesive W81 disposed on the second conductive seat 340 are to be used to fix the integrated chip 400. In this way, each of the conductive hardened adhesives W71 and W81 is to have a larger adhesive point. When the adhesive point is too large so as to touch the crystal chip 410, the adhesive point can generate interference to the oscillation of the crystal chip 410.

In the prior art, the adhesion technique in the industry of the crystal resonator is used for adhesion of a chip and a ceramic bottom case, and is described as follows: A lower silver adhesive is dispensed onto a conductive platform (or a conductive seat) of the ceramic bottom case. The chip is disposed onto the lower silver adhesive, and disposes to have a top layer. An upper silver adhesive is dispensed onto the top layer, and is made to align with the lower silver adhesive to clip the chip. The lower and the upper silver adhesives experience an adhesive hardening operation so as to finish the adhesion of the chip and the ceramic bottom case. The adhesion technique is conventionally called an adhesive dispensing technique of 4 adhesive points.

Under a condition that a relatively low frequency product is provided according to this adhesion technique, when the relatively low frequency product used by a customer is applied to a specific technique (such as the use of the ultrasound or the drop), a situation, conventionally called a "chip falling-off" phenomenon or an "adhesive split" phenomenon, can occur. The situation for the product including the chip and the ceramic bottom case is that: the adhesive is peeled off from the ceramic bottom case, or the adhesive is peeled off from the chip. The ceramic bottom case has a support platform; and the right side of the chip is to be supported by the support platform to be disposed under the chip. In order to prevent the peeling situation from happening, a lower adhesive is further dispensed onto the support platform to make the support platform support the right side of the chip through the lower adhesive; and this technique is conventionally called an adhesive dispensing technique of 5 adhesive points. Otherwise, two adhesive points are dispensed onto the ceramic bottom case, wherein the two dispensed adhesive points are to be disposed under the right side of the chip to support the chip; and this technique is conventionally called an adhesive dispensing technique of 6 adhesive points. The purpose of these techniques is to prevent the product from experiencing the abnormal event whereby the chip falls off when the product is operated on with an external force.

Under a condition that the abovementioned adhesive dispensing technique of 4 adhesive points is employed to the production process of a machine, when the mechanism precision of the machine is reduced to cause the clip effect of the lower and the upper silver adhesives to be bad, an adhesive split can occur. When the clip effect is serious, a "chip falling-off" phenomenon can occur. The bad clip effect finally causes the electrical test of the product to be abnormal. Under a condition that a relatively low frequency product is provided according to the bad clip effect, when the relatively low frequency product used by a customer is applied to a specific technique (such as the use of the ultrasound or the drop), a situation for the product including the chip and the ceramic bottom case can occur, and is that: the adhesive is peeled off from the ceramic bottom case, or the adhesive is peeled off from the chip. Although the abovementioned adhesive dispensing technique of 5/6 adhesive points may prevent the chip from the "chip falling-off" or "adhesive split" phenomenon, the abovementioned adhesive dispensing technique of 5/6 adhesive points can cause the impedance value of the product oscillation to increase. The increase of the impedance value causes the production yield rate to decrease, and can influence the match use effect of the customer end in the serious condition. In addition, the abovementioned adhesive dispensing technique of 5/6 adhesive points can reduce the productivity at the chip disposing station by half, so that the production cost is larger.

SUMMARY OF EXEMPLARY EMBODIMENTS

It is one aspect of the present disclosure to provide a crystal device, which includes a conductive seat, an integrated chip, a first conductive adhesive and a second conductive adhesive. The conductive seat, the integrated chip, the first conductive adhesive and the second conductive adhesive have a specific spatial relationship therebetween. According to the specific spatial relationship, the crystal device may better capture vibration energy, enhances the support intensity of the integrated chip, and may sufficiently satisfy the characteristic requirement of the anti-drop for the mobile device.

For the drawback existing in the abovementioned current production technique, a specific adhesive dispensing needle of a quartz crystal resonator and an adhesive dispensing method are provided in the present disclosure. This solves the phenomenon of the adhesive dispensing product when the clip effect of the lower and the upper silver adhesives is bad due to the precision problem of the adhesive dispensing machine, and thus the test yield rate is raised. The needle and the method solve the "chip falling-off" or "adhesive split" risk for the relatively low frequency product of 4 adhesive points when a customer end uses a specific technique (such as the use of the ultrasound or the drop). For the relatively low frequency product of 5/6 adhesive points, the needle and the method solve the problem that the chip upload station in the production technique for adhesive dispensing causes the production efficiency to be bad due to the increased number of times of adhesive dispensing. The needle and the method solve the problem that the impedance value of the product is larger due to the adhesive dispensing technique of 5/6 adhesive points.

It is therefore one embodiment of the present disclosure to provide a crystal device. The crystal device includes a bearing base, an integrated chip, a first conductive adhesive and a second conductive adhesive. The bearing base includes a first conductive seat. The integrated chip includes a principal reference plane facing the first conductive seat, and having a first major axis. The first conductive adhesive has a first geometric center, and is at least partly disposed between the first conductive seat and the integrated chip. The second conductive adhesive has a second geometric center, and is at least partly disposed between the first conductive seat and the integrated chip. The principal reference plane further has a first perpendicular projection position defined according to the first geometric center, a second perpendicular projection position defined according to the second geometric center, and a first reference straight line passing through the first and the second perpendicular projection positions. A first specific angle is included by the first reference straight line and the first major axis, and ranges from 0 degree to 90 degrees.

It is therefore another embodiment of the present disclosure to provide a crystal device. The crystal device includes a bearing base, an integrated chip and a first conductive adhesive unit. The bearing base includes a first conductive seat. The integrated chip includes a principal reference plane facing the first conductive seat, and having a first major axis. The first conductive adhesive unit has a second major axis and a first aspect ratio, and is at least partly disposed between the first conductive seat and the integrated chip. The first aspect ratio ranges from 1.1 to 1.9. The principal reference plane further has a first perpendicular projection straight line defined according to the second major axis. A first practical angle is included by the first perpendicular projection straight line and the first major axis, and ranges from 0 degree to 90 degrees.

It is therefore another embodiment of the present disclosure to provide a method for manufacturing a crystal device. The method includes the following steps: A bearing base including a first conductive seat, a first reference target area at least partly disposed on the first conductive seat, and a second reference target area at least partly disposed on the first conductive seat is provided, wherein the first reference target area has a first reference position, and the second reference target area has a second reference position being different from the first reference position. The first reference target area is made to receive a first conductive adhesive being in a relatively low hardened state with reference to the first reference position. The second reference target area is made to receive a second conductive adhesive being in the relatively low hardened state with reference to the second reference position. An integrated chip including a principal reference plane having a first major axis is provided. The integrated chip is disposed onto the first and the second conductive adhesives, wherein the principal reference plane faces the first conductive seat, and further has a first perpendicular projection position defined according to the first reference position, a second perpendicular projection position defined according to the second reference position, and a first reference straight line passing through the first and the second perpendicular projection positions, a first specific angle is included by the first reference straight line and the first major axis, and the first specific angle ranges from 0 degree to 90 degrees. The first conductive adhesive is cured in a first relatively high hardened state. The second conductive adhesive is cured in a second relatively high hardened state.

BRIEF DESCRIPTION OF THE DRAWINGS

The foregoing and other features and advantages of the present disclosure will be more clearly understood through the following descriptions with reference to the drawings, wherein:

FIG. 8A is a schematic diagram showing a top view of an implementation structure of the crystal device shown in FIG. 2A;

DETAILED DESCRIPTION OF THE PREFERRED EMBODIMENTS

The present disclosure will now be described more specifically with reference to the following embodiments. It is to be noted that the following descriptions of preferred embodiments of this disclosure are presented herein for the purposes of illustration and description only; they are not intended to be exhaustive or to be limited to the precise form disclosed.

Figure 1A:
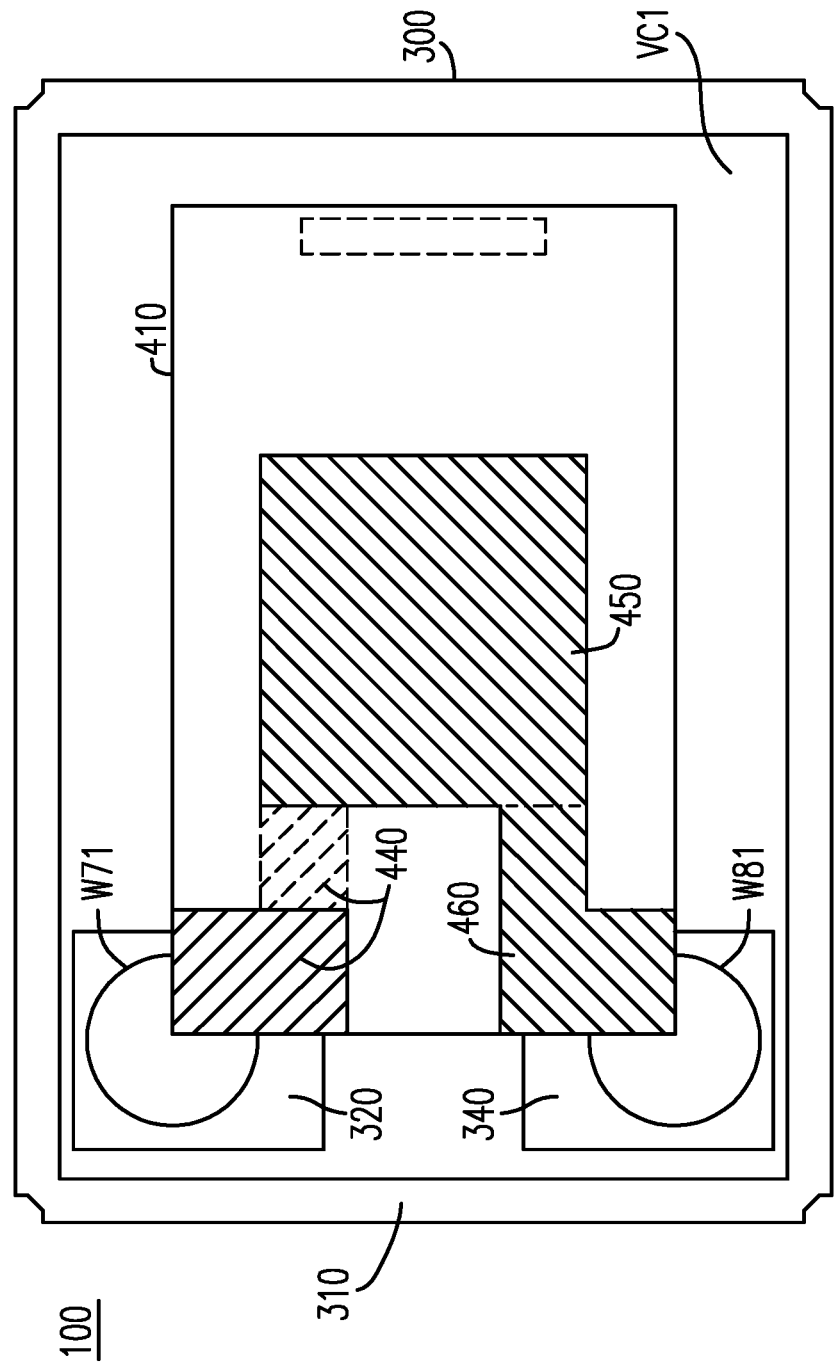
FIG. 1A is a schematic diagram showing a top view of a crystal device in the prior art.
Figure 1B:
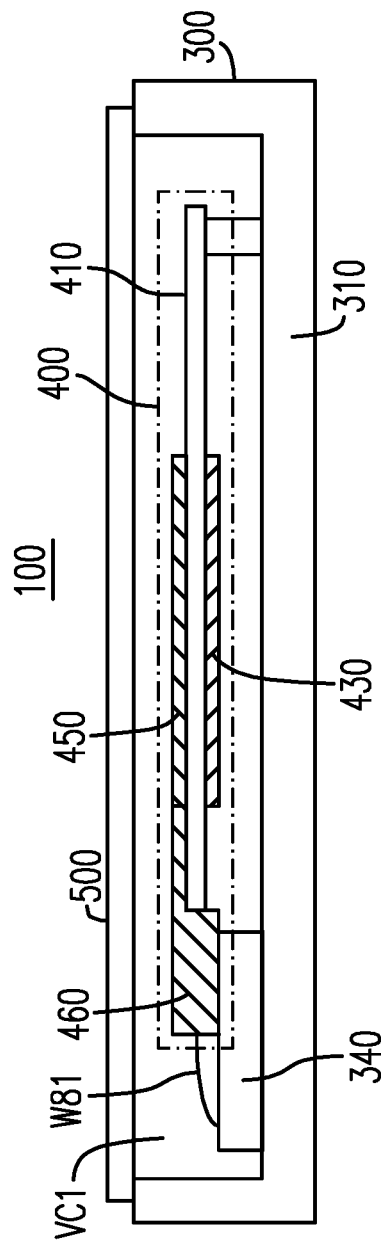
FIG. 1B is a schematic diagram showing a front view of the crystal device shown in FIG. 1A.
Figure 2A:
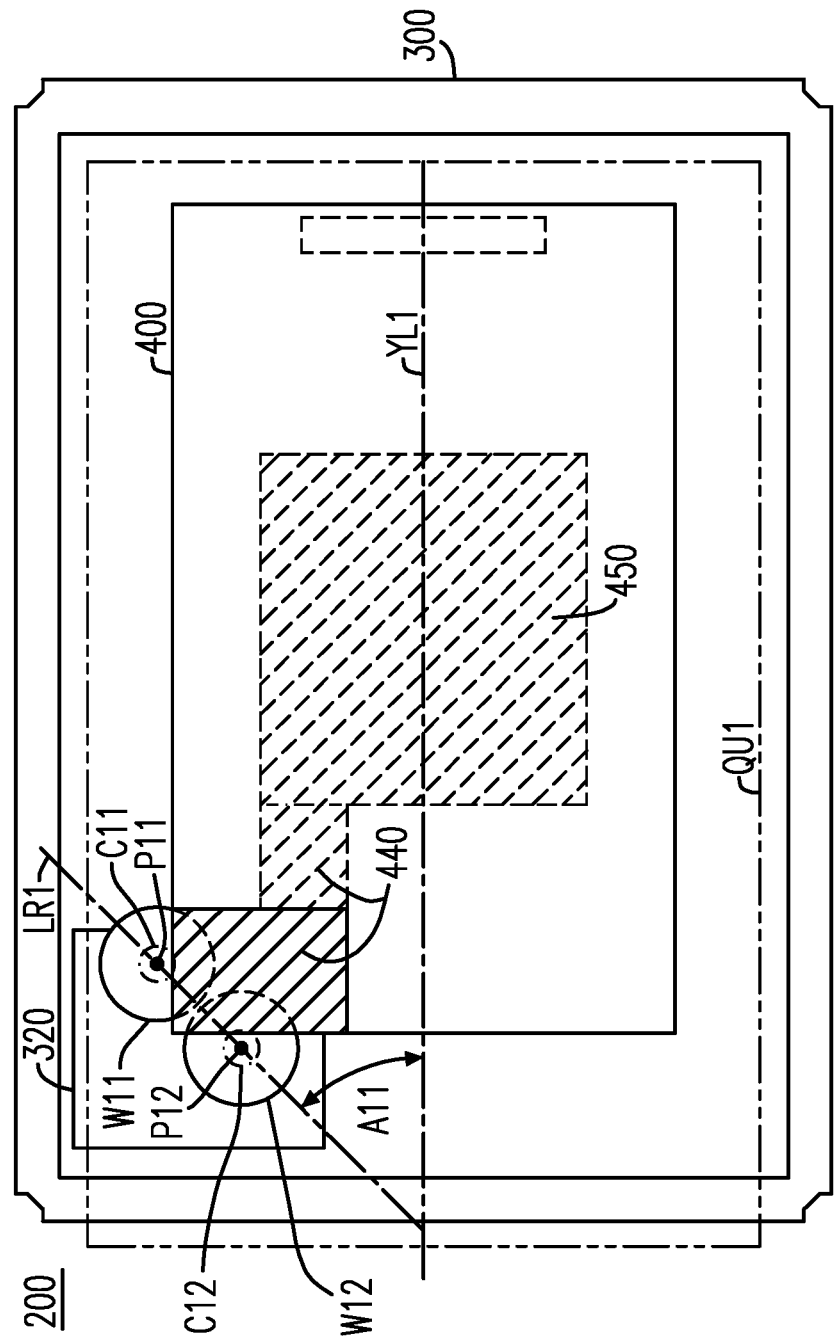
FIG. 2A is a schematic diagram showing a top view of a crystal device according to various embodiments of the present disclosure.
Figure 2B:
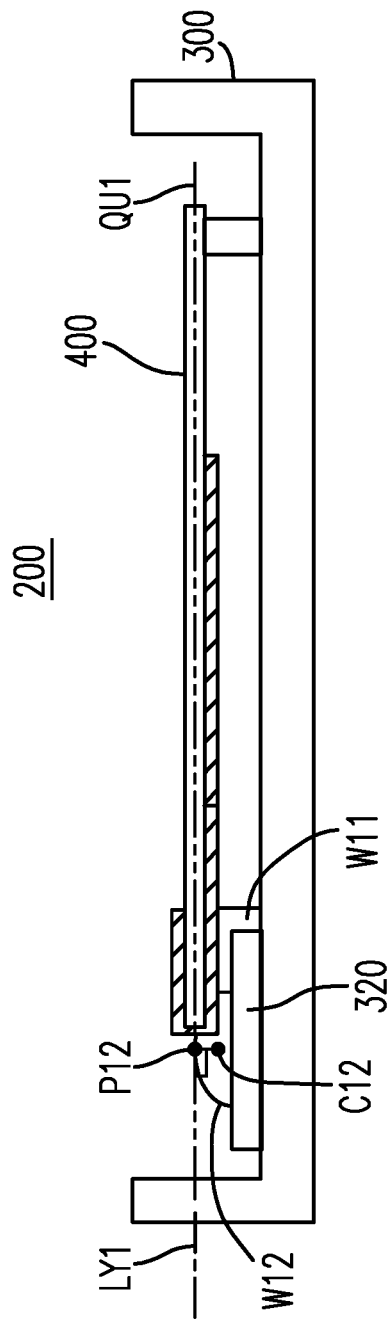
FIG. 2B is a schematic diagram showing a front view of the crystal device shown in FIG. 2A.
Figure 2C:
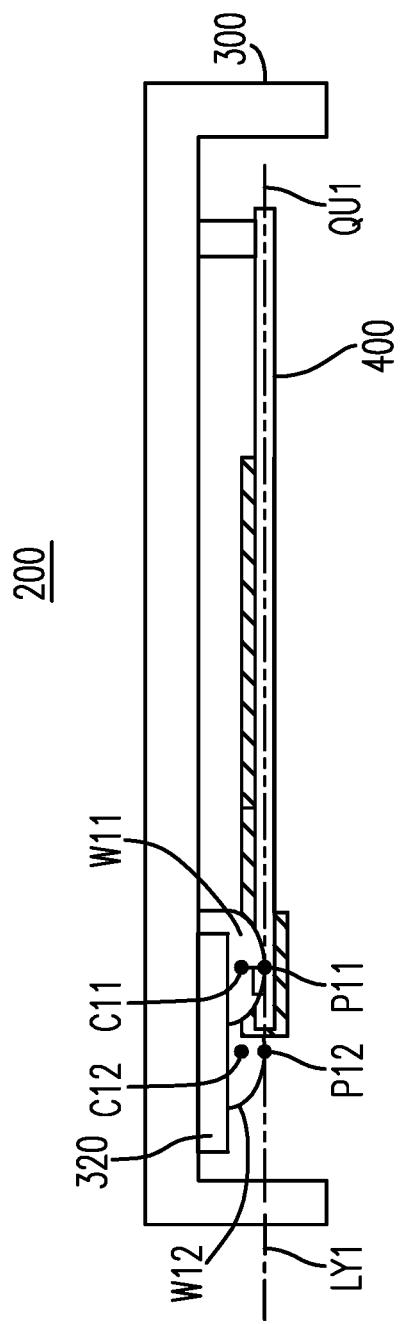
FIG. 2C is a schematic diagram showing a rear view of the crystal device shown in FIG. 2A.

Please refer to FIG. 2A, FIG. 2B and FIG. 2C. FIG. 2A is a schematic diagram showing a top view of a crystal device 200 according to various embodiments of the present disclosure. FIG. 2B is a schematic diagram showing a front view of the crystal device 200 shown in FIG. 2A. FIG. 2C is a schematic diagram showing a rear view of the crystal device 200 shown in FIG. 2A. As shown in FIGS. 2A, 2B and 2C, the crystal device 200 includes a bearing base 300, an integrated chip 400, a first conductive adhesive W11 and a second conductive adhesive W12. The bearing base 300 includes a first conductive seat 320. The integrated chip 400 includes a principal reference plane QU1 facing the first conductive seat 320. For example, the principal reference plane QU1 has a first major axis YL1.

The first conductive adhesive W11 has a first geometric center C11, and is at least partly disposed between the first conductive seat 320 and the integrated chip 400. The second conductive adhesive W12 has a second geometric center C12, and is at least partly disposed between the first conductive seat 320 and the integrated chip 400. For example, the principal reference plane QU1 further has a first perpendicular projection position P11 defined according to the first geometric center C11, a second perpendicular projection position P12 defined according to the second geometric center C12, and a first reference straight line LR1 passing through the first and the second perpendicular projection positions P11 and P12. A specific angle A11 is included by the first reference straight line LR1 and the first major axis YL1. The first specific angle A11 ranges from 0 degree to 90 degrees. For example, the first and the second geometric centers C11 and C12 are two centroids, respectively.

Figure 3:
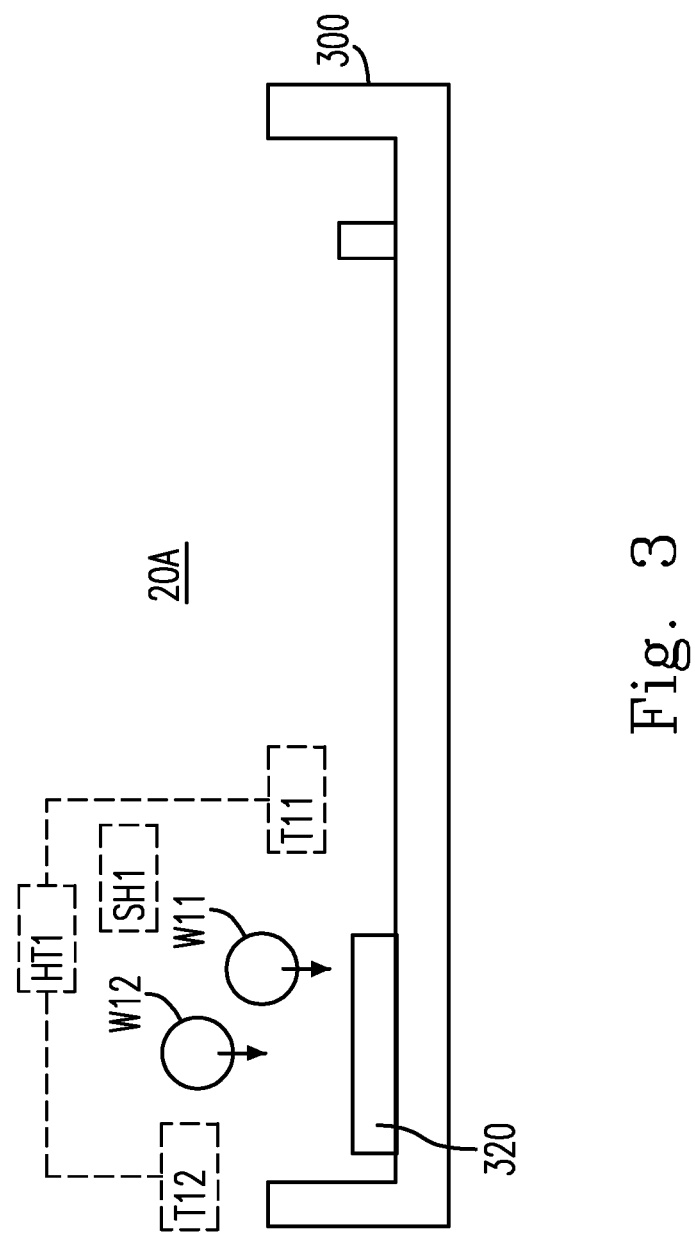
FIG. 3 is a schematic diagram showing a front view of an implementation structure of the crystal device shown in FIG. 2A.
Figure 4A:
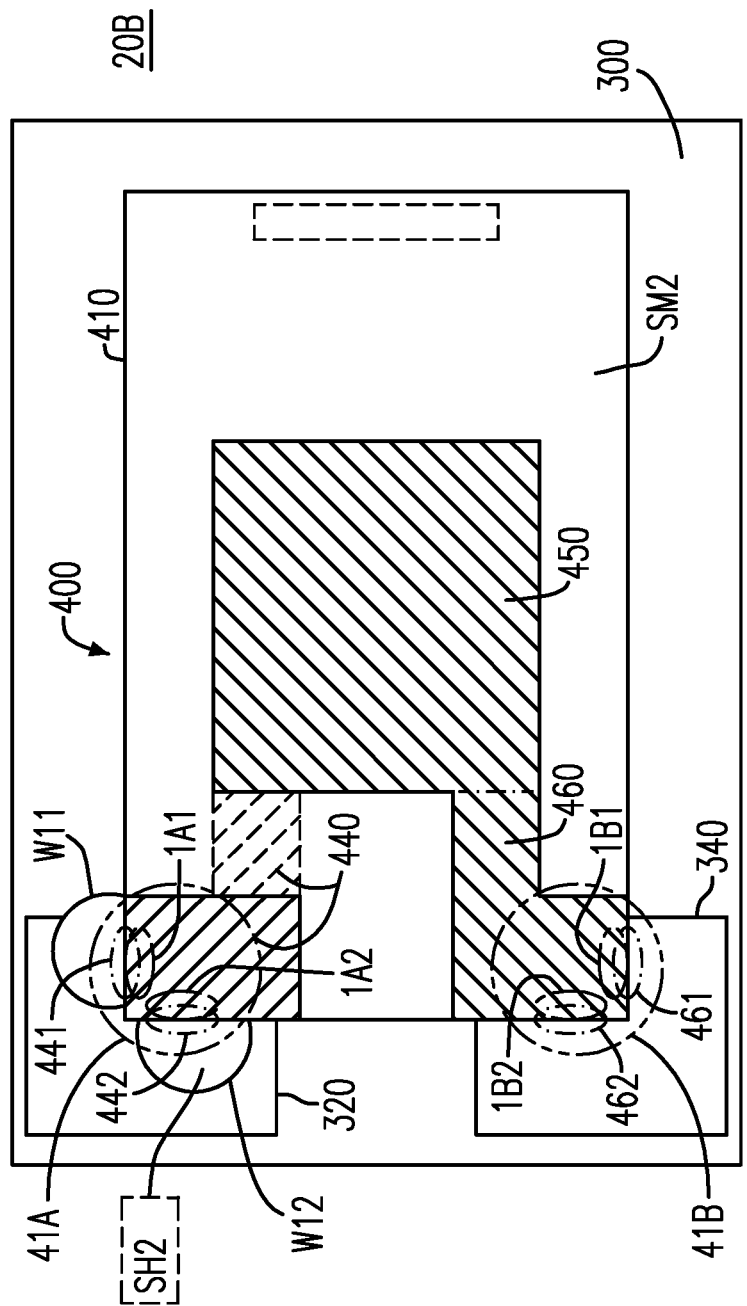
FIG. 4A is a schematic diagram showing a top view of an implementation structure of the crystal device shown in FIG. 2A.
Figure 4B:
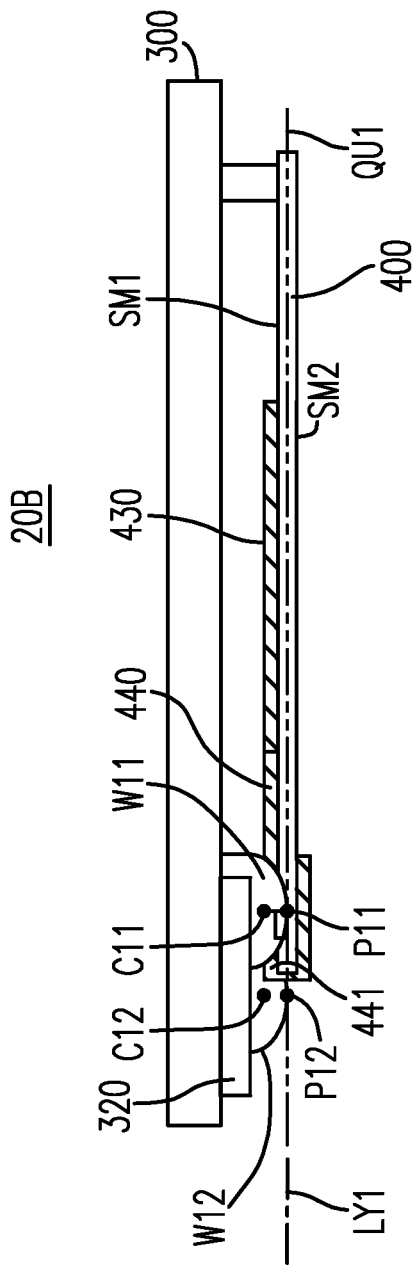
FIG. 4B is a schematic diagram showing a rear view of the implementation structure shown in FIG. 4A.
Figure 4C:
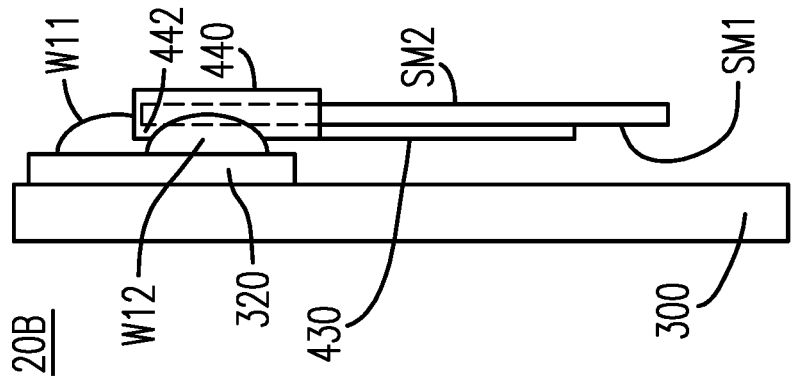
FIG. 4C is a schematic diagram showing a left side view of the implementation structure shown in FIG. 4A.

Please refer to FIG. 3, FIG. 4A, FIG. 4B and FIG. 4C. FIG. 3 is a schematic diagram showing a front view of an implementation structure 20A of the crystal device 200 shown in FIG. 2A. FIG. 4A is a schematic diagram showing a top view of an implementation structure 20B of the crystal device 200 shown in FIG. 2A. FIG. 4B is a schematic diagram showing a rear view of the implementation structure 20B shown in FIG. 4A. FIG. 4C is a schematic diagram showing a left side view of the implementation structure 20B shown in FIG. 4A. Please additionally refer to FIGS. 2A, 2B and 2C. As shown in FIGS. 3, 4A, 4B and 4C, the crystal device 200 includes the bearing base 300, the integrated chip 400, the first conductive adhesive W11 and the second conductive adhesive W12, and is a crystal resonator or a crystal resonance unit.

In some embodiments, the first conductive adhesive W11 is contiguous with or separate from the second conductive adhesive W12. The bearing base 300 receives at a first operation time T11 the first conductive adhesive W11 being in a relatively low hardened state SH1, and receives at a second operation time T12 the second conductive adhesive W12 being in the relatively low hardened state SH1. The first conductive adhesive W11 being in the relatively low hardened state SH1 is hardened to be in a relatively high hardened state SH2. The second conductive adhesive W12 being in the relatively low hardened state SH1 is hardened to be in the relatively high hardened state SH2. The first and the second operation times T11 and T12 have a time interval HT1 therebetween. The time interval HT1 ranges from 0.1 second to 1.0 second.

The bearing base 300 further includes a second conductive seat 340 being separate from the first conductive seat 320. The integrated chip 400 includes a crystal chip 410, a first excitation electrode 430, a second excitation electrode 450, a first extension electrode 440 and a second extension electrode 460. For example, the crystal chip 410 is a quartz chip. The crystal chip 410 has a first corner portion 41A being adjacent to the first conductive seat 320, a second corner portion 41B being adjacent to the second conductive seat 340, and is formed as a crystal plate. The crystal chip 410 includes a first main surface SM1 and a second main surface SM2 being opposite to the first main surface SM1. For example, the first corner portion 41A has a first side portion 1A1 and a second side portion 1A2 being adjacent to the first side portion 1A1. For example, preferably, the first specific angle A11 ranges from 30 degrees to 60 degrees. The first and the second excitation electrodes 430 and 450 are respectively a first metal electrode and a second metal electrode.

The first excitation electrode 430 is coupled to the first main surface SM1. The second excitation electrode 450 is coupled to the second main surface SM2. The first extension electrode 440 is extended from the first excitation electrode 430 to the first corner portion 41A, and includes a first edge portion 441 being in contact with the first side portion 1A1, and a second edge portion 442 being in contact with the second side portion 1A2. The second extension electrode 460 is extended from the second excitation electrode 450 to the second corner portion 41B. The first conductive adhesive W11 is in contact with the first conductive seat 320, and is in contact with the first edge portion 441. The second conductive adhesive W12 is in contact with the first conductive seat 320, and is in contact with the second edge portion 442. For example, the second corner portion 41B has a first side portion 1B1 and a second side portion 1B2 being adjacent to the first side portion 1B1. The second extension electrode 460 includes a first edge portion 461 being in contact with the first side portion 1B1, and a second edge portion 462 being in contact with the second side portion 1B2.

Figure 5A:
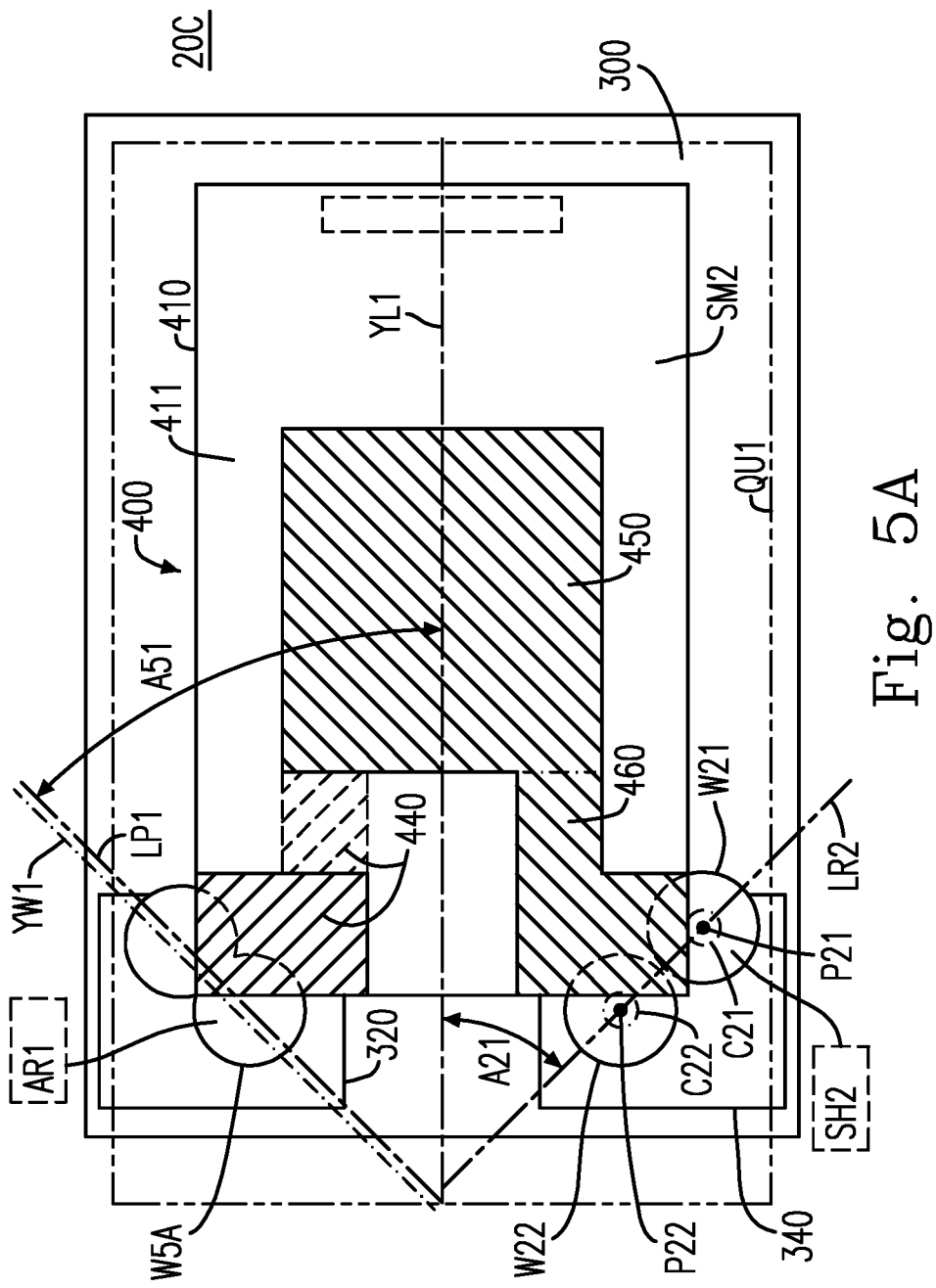
FIG. 5A is a schematic diagram showing a top view of an implementation structure of the crystal device shown in FIG. 2A.
Figure 5B:
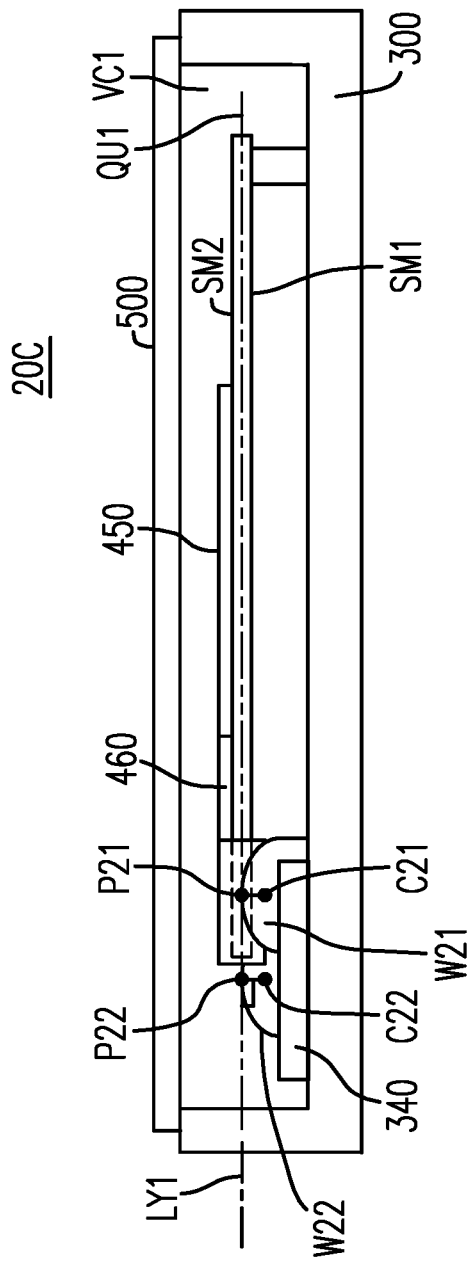
FIG. 5B is a schematic diagram showing a front view of the implementation structure shown in FIG. 5A.
Figure 5C:
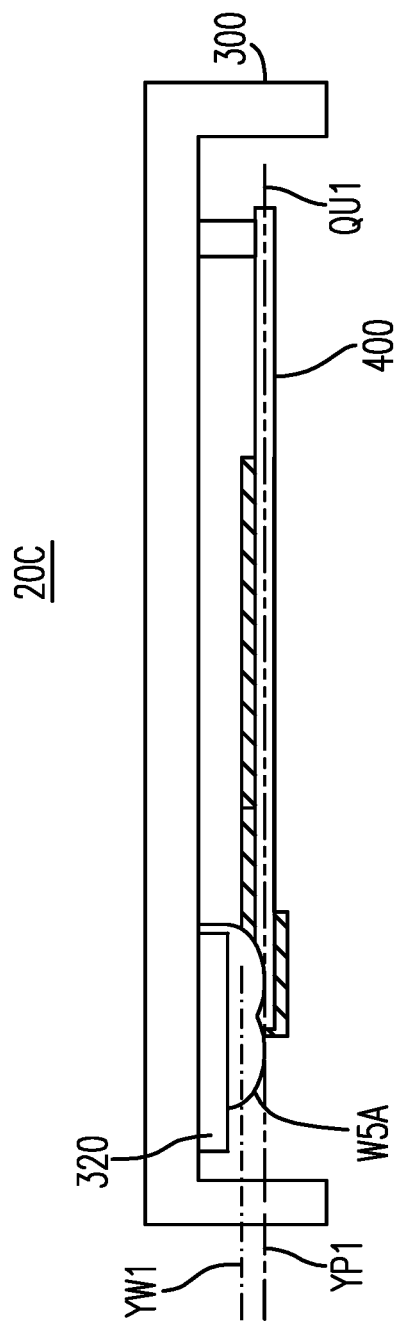
FIG. 5C is a schematic diagram showing a rear view of the implementation structure shown in FIG. 5A.

Please refer to FIG. 5A, FIG. 5B and FIG. 5C. FIG. 5A is a schematic diagram showing a top view of an implementation structure 20C of the crystal device 200 shown in FIG. 2A. FIG. 5B is a schematic diagram showing a front view of the implementation structure 20C shown in FIG. 5A. FIG. 5C is a schematic diagram showing a rear view of the implementation structure 20C shown in FIG. 5A. Please additionally refer to FIGS. 2A, 2B, 2C, 4A, 4B and 4C. As shown in FIGS. 5A, 5B and 5C, the crystal device 200 includes the bearing base 300, the integrated chip 400, the first conductive adhesive W11 and the second conductive adhesive W12.

In some embodiments, the crystal device 200 is a quartz crystal resonator. The first and the second conductive adhesives W11 and W12 are merged to form a conductive adhesive unit W5A. The conductive adhesive unit W5A has a second major axis YW1 and an aspect ratio AR1. The aspect ratio AR1 ranges from 1.1 to 1.9. The principal reference plane QU1 has a perpendicular projection straight line LP1 defined according to the second major axis YW1. A practical angle A51 is included by the perpendicular projection straight line LP1 and the first major axis YL1. The practical angle A51 ranges from 0 degree to 90 degrees.

The crystal device 200 further includes a third conductive adhesive W21 and a fourth conductive adhesive W22. The third conductive adhesive W21 has a third geometric center C21, and is at least partly disposed between the second conductive seat 340 and the second extension electrode 460. The fourth conductive adhesive W22 has a fourth geometric center C22, and is at least partly disposed between the second conductive seat 340 and the second extension electrode 460. The principal reference plane QU1 further has a third perpendicular projection position P21 defined according to the third geometric center C21, a fourth perpendicular projection position P22 defined according to the fourth geometric center C22, and a second reference straight line LR2 passing through the third and the fourth perpendicular projection positions P21 and P22. For example, the third and the fourth geometric centers C21 and C22 are two centroids, respectively.

A second specific angle A21 is included by the second reference straight line LR2 and the first major axis YL1. The second specific angle A21 ranges from 0 degree to 90 degrees. For example, the principal reference plane QU1 faces the second conductive seat 340. The third conductive adhesive W21 is in contact with the second conductive seat 340, and is in contact with the first edge portion 461. The fourth conductive adhesive W22 is in contact with the second conductive seat 340, and is in contact with the second edge portion 462. For example, the crystal chip 410 has a cuboid (or a rectangular parallelepiped) 411. For example, preferably, the practical angle A51 ranges from 30 degrees to 60 degrees. Preferably, the second specific angle A21 ranges from 30 degrees to 60 degrees.

Figure 6:
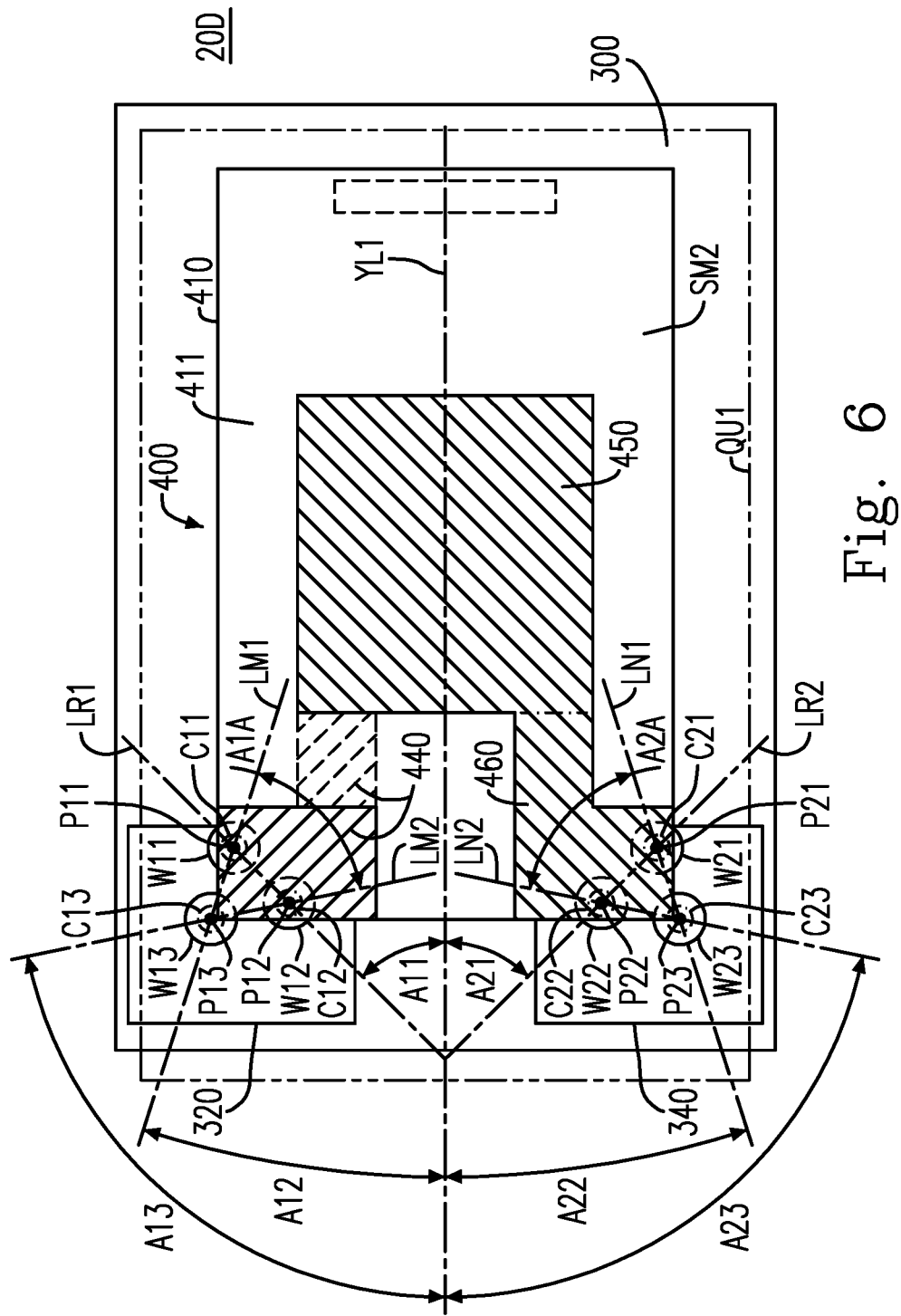
FIG. 6 is a schematic diagram showing a top view of an implementation structure of the crystal device shown in FIG. 2A.

Please refer to FIG. 6, which is a schematic diagram showing a top view of an implementation structure 20D of the crystal device 200 shown in FIG. 2A. As shown in FIG. 6, the crystal device 200 includes the bearing base 300, the integrated chip 400, the first conductive adhesive W11 and the second conductive adhesive W12. The first and the second conductive adhesives W11 and W12 respectively have a first body volume and a second body volume. The first body volume is the same as or different from the second body volume.

In some embodiments, the crystal device 200 further includes a third conductive adhesive W13. The third conductive adhesive W13 has a third geometric center C13, and is at least partly disposed between the first conductive seat 320 and the integrated chip 400. The principal reference plane QU1 further has a third perpendicular projection position P13 defined according to the third geometric center C13, a second reference straight line LM1 passing through the third and the first perpendicular projection positions P13 and P11, and a third reference straight line LM2 passing through the third and the second perpendicular projection positions P13 and P12.

A second specific angle A12 is included by the second reference straight line LM1 and the first major axis YL1. The second specific angle A12 ranges from 0 degree to 90 degrees. A third specific angle A13 is included by the third reference straight line LM2 and the first major axis YL1. The third specific angle A13 ranges from 0 degree to 90 degrees.

The third conductive adhesive W13 has a third body volume. The third body volume is the same as or different from the first body volume. The third body volume is the same as or different from the second body volume.

A specific angle A1A is included by the second and the third reference straight lines LM1 and LM2. The specific angle A1A ranges from 30 degrees to 150 degrees. The third conductive adhesive W13 is contiguous with or separate from the first conductive adhesive W11. The third conductive adhesive W13 is contiguous with or separate from the second conductive adhesive W12. For example, the third geometric center C13 is a geometric center. Preferably, the specific angle A1A ranges from 40 degrees to 130 degrees. For example, the integrated chip 400 has a body shape and the first major axis YL1 defined according to the body shape.

In some embodiments, the crystal device 200 further includes a conductive adhesive W23. The conductive adhesive W23 has a geometric center C23, and is at least partly disposed between the second conductive seat 340 and the integrated chip 400. The principal reference plane QU1 further has a perpendicular projection position P23 defined according to the geometric center C23, a reference straight line LN1 passing through the perpendicular projection position P23 and the third perpendicular projection position P21, and a reference straight line LN2 passing through the perpendicular projection position P23 and the fourth perpendicular projection position P22.

A specific angle A22 is included by the reference straight line LN1 and the first major axis YL1. The specific angle A22 ranges from 0 degree to 90 degrees. A specific angle A23 is included by the reference straight line LN2 and the first major axis YL1. The specific angle A23 ranges from 0 degree to 90 degrees. The third conductive adhesive W21, the fourth conductive adhesive W22 and the conductive adhesive W23 respectively have a fourth body volume, a fifth body volume, a sixth body volume. The fourth body volume is the same as or different from the fifth body volume. The sixth body volume is the same as or different from the fourth body volume. The sixth body volume is the same as or different from the fifth body volume.

A specific angle A2A is included by the reference straight lines LN1 and LN2. The specific angle A2A ranges from 30 degrees to 150 degrees. The conductive adhesive W23 is contiguous with or separate from the third conductive adhesive W21. The conductive adhesive W23 is contiguous with or separate from the fourth conductive adhesive W22. For example, the geometric center C23 is a geometric center. Preferably, the specific angle A2A ranges from 40 degrees to 130 degrees.

Figure 7A:
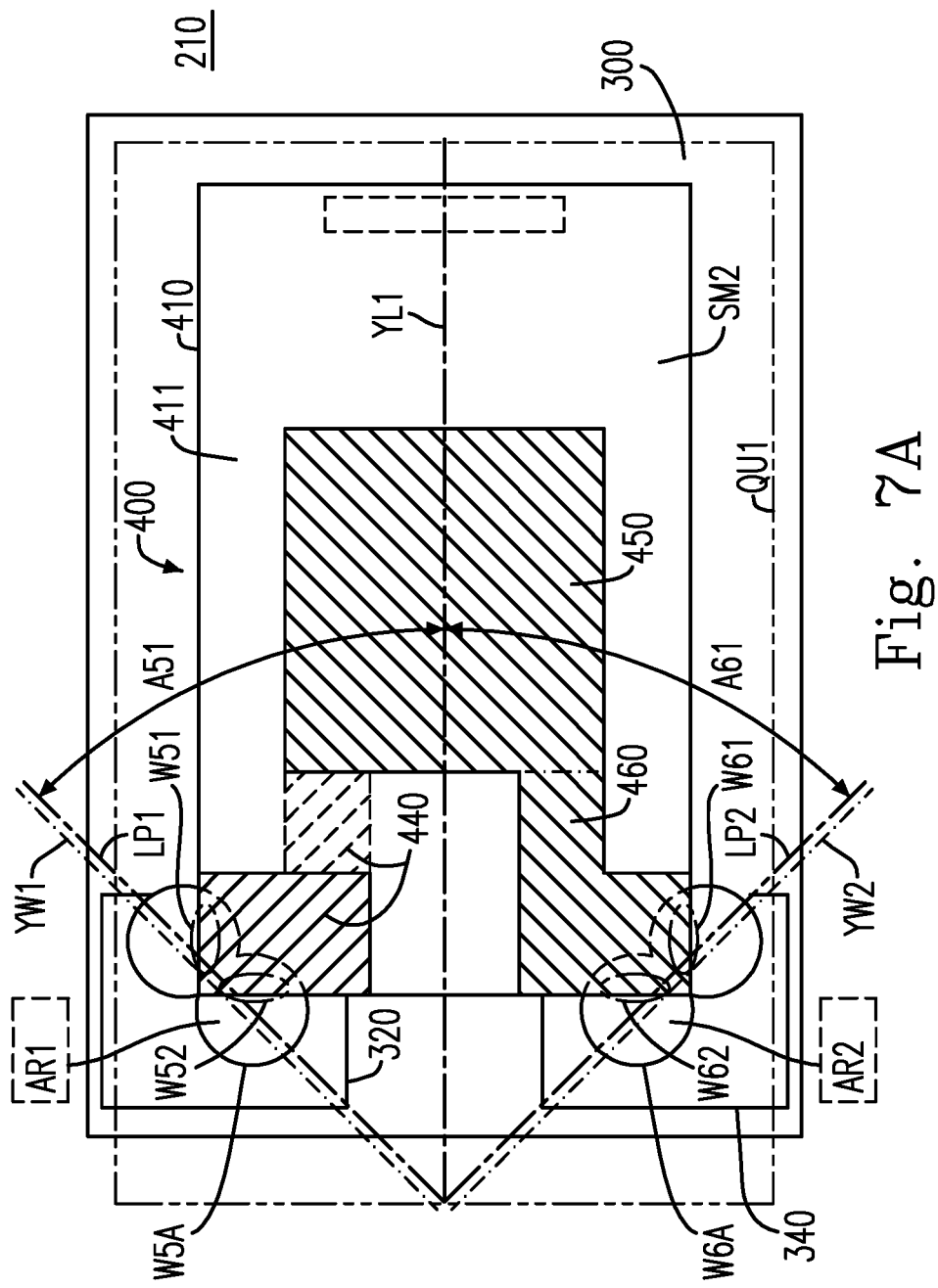
FIG. 7A is a schematic diagram showing a top view of a crystal device according to various embodiments of the present disclosure.
Figure 7B:
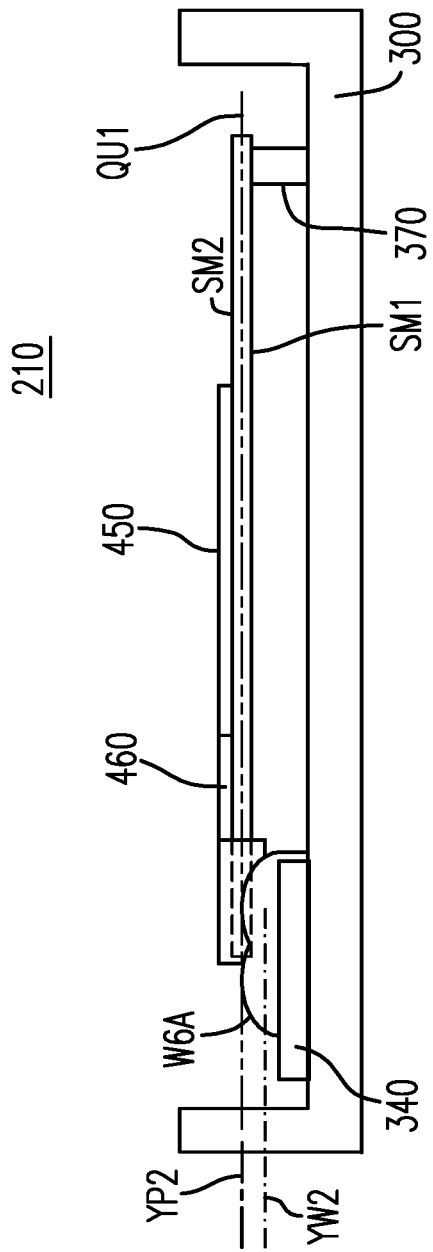
FIG. 7B is a schematic diagram showing a front view of the crystal device shown in FIG. 7A.

Please refer to FIG. 7A and FIG. 7B. FIG. 7A is a schematic diagram showing a top view of a crystal device 210 according to various embodiments of the present disclosure. FIG. 7B is a schematic diagram showing a front view of the crystal device 210 shown in FIG. 7A. Please additionally refer to FIGS. 5A and 5C. As shown in FIGS. 7A, 7B, 5A and 5C, the crystal device 210 includes a bearing base 300, an integrated chip 400 and a first conductive adhesive unit W5A. The bearing base 300 includes a first conductive seat 320. The integrated chip 400 includes a principal reference plane QU1 facing the first conductive seat 320. For example, the principal reference plane QU1 has a first major axis YL1.

The first conductive adhesive unit W5A has a second major axis YW1 and a first aspect ratio AR1, and is at least partly disposed between the first conductive seat 320 and the integrated chip 400. For example, the first aspect ratio AR1 ranges from 1.1 to 1.9. The principal reference plane QU1 further has a first perpendicular projection straight line LP1 defined according to the second major axis YW1. A first practical angle A51 is included by the first perpendicular projection straight line LP1 and the first major axis YL1. The first practical angle A51 ranges from 0 degree to 90 degrees.

Please refer to FIGS. 7A, 7B, 3, 4A, 4B and 4C. In some embodiments, the first conductive adhesive unit W5A is formed by merging a first conductive adhesive W11 being in a relatively low hardened state SH1 with a second conductive adhesive W12 being in the relatively low hardened state SH1. The bearing base 300 receives at a first operation time T11 the first conductive adhesive W11 being in the relatively low hardened state SH1, and receives at a second operation time T12 the second conductive adhesive W12 being in the relatively low hardened state SH1. The first conductive adhesive unit W5A being in the relatively low hardened state SH1 is hardened to be in a relatively high hardened state SH2. The first and the second operation times T11 and T12 have a time interval HT1 therebetween. The time interval HT1 ranges from 0.1 second to 1.0 second. For example, the crystal device 210 is a crystal resonator or a crystal resonance unit.

The bearing base 300 further includes a second conductive seat 340 being separate from the first conductive seat 320. The integrated chip 400 includes a crystal chip 410, a first excitation electrode 430, a second excitation electrode 450, a first extension electrode 440 and a second extension electrode 460. For example, the crystal chip 410 is a quartz chip. The crystal chip 410 has a first corner portion 41A being adjacent to the first conductive seat 320, a second corner portion 41B being adjacent to the second conductive seat 340, and is formed as a crystal plate. The crystal chip 410 includes a first main surface SM1 and a second main surface SM2 being opposite to the first main surface SM1. For example, the first corner portion 41A has a first side portion 1A1 and a second side portion 1A2 being adjacent to the first side portion 1A1. The second corner portion 41B has a first side portion 1B1 and a second side portion 1B2 being adjacent to the first side portion 1B1.

In some embodiments, the first excitation electrode 430 is coupled to the first main surface SM1. The second excitation electrode 450 is coupled to the second main surface SM2. The first extension electrode 440 is extended from the first excitation electrode 430 to the first corner portion 41A, and includes a first edge portion 441 being in contact with the first side portion 1A1, and a second edge portion 442 being in contact with the second side portion 1A2. The second extension electrode 460 is extended from the second excitation electrode 450 to the second corner portion 41B, and includes a first edge portion 461 being in contact with the first side portion 1B1, and a second edge portion 462 being in contact with the second side portion 1B2. A first portion W51 of the first conductive adhesive unit W5A is in contact with the first conductive seat 320, and is in contact with the first edge portion 441. A second portion W52 of the first conductive adhesive unit W5A is in contact with the first conductive seat 320, and is in contact with the second edge portion 442.

The crystal device 210 is a quartz crystal resonator, and further includes a second conductive adhesive unit W6A. The second conductive adhesive unit W6A has a third major axis YW2 and a second aspect ratio AR2, and is at least partly disposed between the second conductive seat 340 and the second extension electrode 460. The second aspect ratio AR2 ranges from 1.1 to 1.9. The principal reference plane QU1 further has a second perpendicular projection straight line LP2 defined according to the third major axis YW2. A second practical angle A61 is included by the second perpendicular projection straight line LP2 and the first major axis YL1. The second practical angle A61 ranges from 0 degree to 90 degrees.

For example, preferably, the second practical angle A61 ranges from 30 degrees to 60 degrees. A first portion W61 of the second conductive adhesive unit W6A is in contact with the second conductive seat 340, and is in contact with the first edge portion 461. A second portion W62 of the second conductive adhesive unit W6A is in contact with the second conductive seat 340, and is in contact with the second edge portion 462.

Figure 8B:
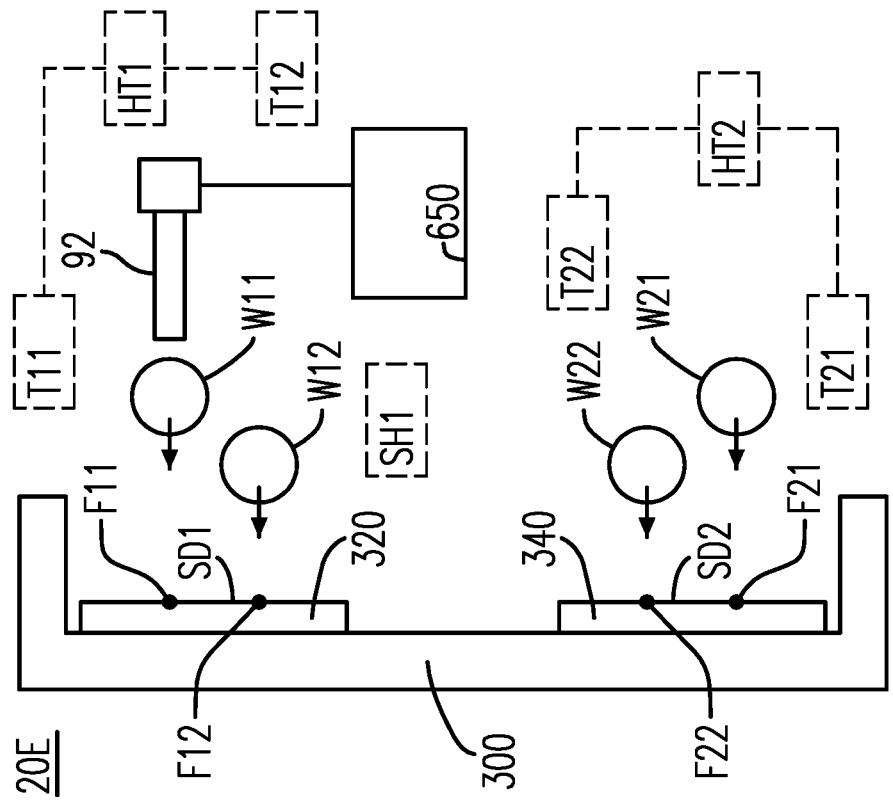
FIG. 8B is a schematic diagram showing a left side view of the implementation structure shown in FIG. 8A.
Figure 8C:
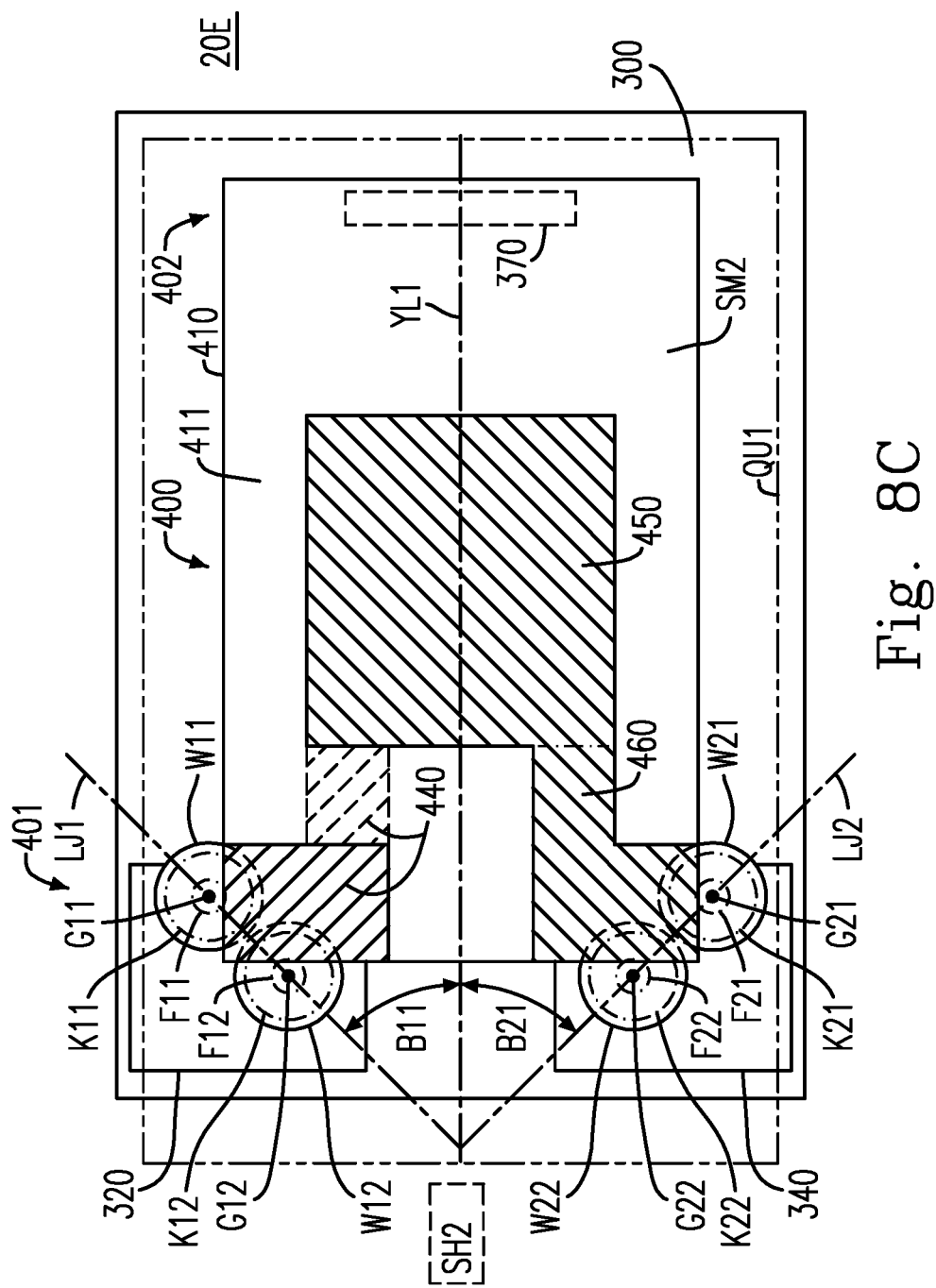
FIG. 8C is a schematic diagram showing a top view of the implementation structure shown in FIG. 8A.

Please refer to FIG. 8A, FIG. 8B and FIG. 8C. FIG. 8A is a schematic diagram showing a top view of an implementation structure 20E of the crystal device 200 shown in FIG. 2A. FIG. 8B is a schematic diagram showing a left side view of the implementation structure 20E shown in FIG. 8A. FIG. 8C is a schematic diagram showing a top view of the implementation structure 20E shown in FIG. 8A. As shown in FIGS. 8A, 8B and 8C, a method for manufacturing a crystal device 200 is disclosed.

The method includes the following steps: A bearing base 300 is provided, wherein the bearing base 300 includes a first conductive seat 320, a first reference target area K11 at least partly disposed on the first conductive seat 320, and a second reference target area K12 at least partly disposed on the first conductive seat 320, the first reference target area K11 has a first reference position F11, and the second reference target area K12 has a second reference position F12 being different from the first reference position F11. The first reference target area K11 is made to receive a first conductive adhesive W11 being in a relatively low hardened state SH1 with reference to the first reference position F11. The second reference target area K12 is made to receive a second conductive adhesive W12 being in the relatively low hardened state SH1 with reference to the second reference position F12. In addition, an integrated chip 400 is provided, wherein the integrated chip 400 includes a principal reference plane QU1 having a first major axis YL1.

The method further includes the following steps: The integrated chip 400 is disposed onto the first and the second conductive adhesives W11 and W12, wherein under a condition that the integrated chip 400 is disposed on the first and the second conductive adhesives W11 and W12, the principal reference plane QU1 faces the first conductive seat 320, and further has a first perpendicular projection position G11 defined according to the first reference position F11, a second perpendicular projection position G12 defined according to the second reference position F12, and a first reference straight line LJ1 passing through the first and the second perpendicular projection positions G11 and G12, a first specific angle B11 is included by the first reference straight line LJ1 and the first major axis YL1, and the first specific angle B11 ranges from 0 degree to 90 degrees. The first conductive adhesive W11 is cured in a first relatively high hardened state. In addition, the second conductive adhesive W12 is cured in a second relatively high hardened state. For example, each of the first and the second relatively high hardened state is equal to the relatively high hardened state SH2.

Please refer to FIGS. 8A, 8B, 8C, 5A and 5C. In some embodiments, the first conductive adhesive W11 is contiguous with or separate from the second conductive adhesive W12. The bearing base 300 further includes a second conductive seat 340 being separate from the first conductive seat 320. The integrated chip 400 includes a crystal chip 410, a first excitation electrode 430, a second excitation electrode 450, a first extension electrode 440 and a second extension electrode 460.

The first and the second conductive adhesives W11 and W12 are merged together to form a conductive adhesive unit W5A. The conductive adhesive unit W5A has a second major axis YW1 and an aspect ratio AR1. The aspect ratio AR1 ranges from 1.1 to 1.9. The principal reference plane QU1 has a perpendicular projection straight line LP1 defined according to the second major axis YW1. A practical angle A51 is included by the perpendicular projection straight line LP1 and the first major axis YL1. The practical angle A51 ranges from 0 degree to 90 degrees.

Please refer to FIGS. 8A, 8B and 8C. The bearing base 300 further includes a third reference target area K21 at least partly disposed on the second conductive seat 340, and a fourth reference target area K22 at least partly disposed on the second conductive seat 340. The first and the third reference target areas K11 and K21 are separate. The third reference target area K21 has a third reference position F21. The fourth reference target area K22 has a fourth reference position F22 being different from the third reference position F21.

In some embodiments, the method further includes the following steps: The third reference target area K21 is made to receive a third conductive adhesive W21 being in the relatively low hardened state SH1 with reference to the third reference position F21. The fourth reference target area K22 is made to receive a fourth conductive adhesive W22 being in the relatively low hardened state SH1 with reference to the fourth reference position F22. The step of disposing the integrated chip 400 onto the first and the second conductive adhesives W11 and W12 includes a sub-step that: the integrated chip 400 is disposed onto the first, the second, the third and the fourth conductive adhesives W11, W12, W21 and W22.

Under a condition that the integrated chip 400 is disposed on the first, the second, the third and the fourth conductive adhesives W11, W12, W21 and W22, the principal reference plane QU1 further has a third perpendicular projection position G21 defined according to the third reference position F21, a fourth perpendicular projection position G22 defined according to the fourth reference position F22, and a second reference straight line LJ2 passing through the third and the fourth perpendicular projection positions G21 and G22, a second specific angle B21 is included by the second reference straight line LJ2 and the first major axis YL1, and the second specific angle B21 ranges from 0 degree to 90 degrees. The method further includes the following steps: The third conductive adhesive W21 is cured in a third relatively high hardened state. In addition, the fourth conductive adhesive W22 is cured in a fourth relatively high hardened state SH2. For example, each of the third and the fourth relatively high hardened state is equal to the relatively high hardened state SH2.

Figure 9:
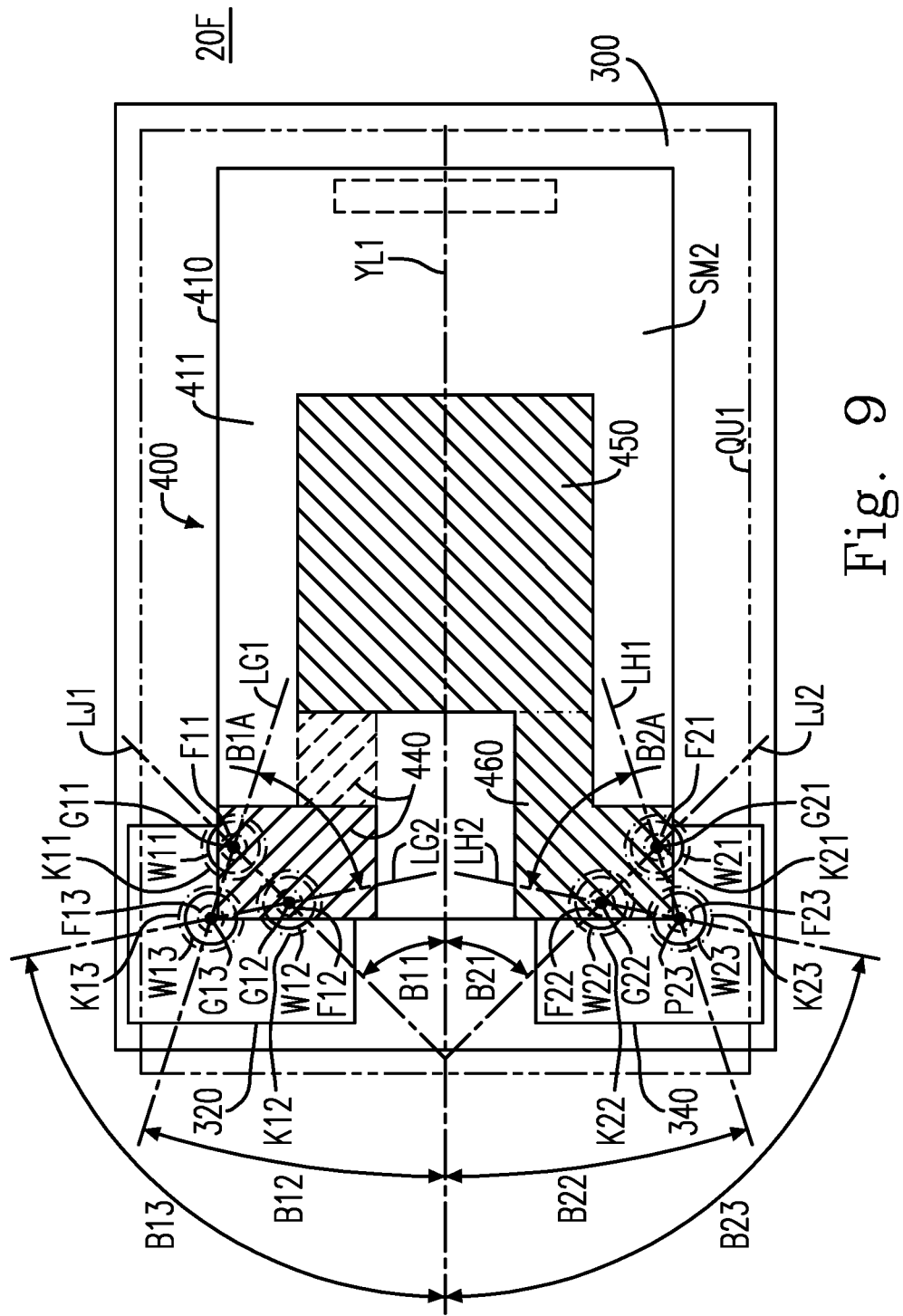
FIG. 9 is a schematic diagram showing a top view of an implementation structure of the crystal device shown in FIG. 2A.

Please refer to FIG. 9, which is a schematic diagram showing a top view of an implementation structure 20F of the crystal device 200 shown in FIG. 2A. In some embodiments, the bearing base 300 further includes a third reference target area K13 at least partly disposed on the first conductive seat 320. For example, the third reference target area K13 has a third reference position F13. The method further includes a step that: the third reference target area K13 is made to receive a third conductive adhesive W13 being in the relatively low hardened state SH1 with reference to the third reference position F13.

The step of disposing the integrated chip 400 onto the first and the second conductive adhesives W11 and W12 includes a sub-step that: the integrated chip 400 is disposed onto the first, the second and the third conductive adhesives W11, W12 and W13. Under a condition that the integrated chip 400 is disposed on the first, the second and the third conductive adhesives W11, W12 and W13, the principal reference plane QU1 further has a third perpendicular projection position G13 defined according the third reference position F13, a second reference straight line LG1 passing through the third and the first perpendicular projection positions G13 and G11, and a third reference straight line LG2 passing through the third and the second perpendicular projection positions G13 and G12.

A second specific angle B12 is included by the second reference straight line LG1 and the first major axis YL1. The second specific angle B12 ranges from 0 degree to 90 degrees. A third specific angle B13 is included by the third reference straight line LG2 and the first major axis YL1. The third specific angle B13 ranges from 0 degree to 90 degrees. The method further includes a step that: the third conductive adhesive W13 is made to harden to be in the relatively high hardened state SH2, or is cured in a fifth relatively high hardened state. The third conductive adhesive W13 is contiguous with or separate from the first conductive adhesive W11. The third conductive adhesive W13 is contiguous with or separate from the second conductive adhesive W12. For example, preferably, the first specific angle B11 ranges from 30 degrees to 60 degrees. Preferably, the second specific angle B21 ranges from 30 degrees to 60 degrees. A specific angle B1A is included by the second and the third reference straight lines LG1 and LG2. The specific angle B1A ranges from 30 degrees to 150 degrees. Preferably, the specific angle B1A ranges from 40 degrees to 130 degrees.

In some embodiments, the bearing base 300 further includes a reference target area K23 at least partly disposed on the second conductive seat 340. For example, the reference target area K23 has a reference position F23. The method further includes a step that: the reference target area K23 is made to receive a conductive adhesive W23 being in the relatively low hardened state SH1 with reference to the reference position F23. The step of disposing the integrated chip 400 onto the first and the second conductive adhesives W11 and W12 includes a sub-step that: the integrated chip 400 is disposed onto the first conductive adhesive W11, the second conductive adhesive W12, the third conductive adhesive W13, the third conductive adhesive W21, the fourth conductive adhesive W22 and the conductive adhesive W23.

Under a condition that the integrated chip 400 is disposed on the first conductive adhesive W11, the second conductive adhesive W12, the third conductive adhesive W13, the third conductive adhesive W21, the fourth conductive adhesive W22 and the conductive adhesive W23, the principal reference plane QU1 further has a perpendicular projection position G23 defined according to the reference position F23, a reference straight line LH1 passing through the perpendicular projection position G23 and the third perpendicular projection position G21, and a reference straight line LH2 passing through the perpendicular projection position G23 and the fourth perpendicular projection position G22.

A specific angle B2A is included by the reference straight lines LH1 and LH2. The specific angle B2A ranges from 30 degrees and 150 degrees. The method further includes a step that: the conductive adhesive W23 is made to harden to be in the relatively high hardened state SH2, or is cured in a sixth relatively high hardened state. The conductive adhesives W23 is contiguous with or separate from the third conductive adhesives W21. The conductive adhesives W23 is contiguous with or separate from the fourth conductive adhesives W22. For example, preferably, the specific angle B2A ranges from 40 degrees to 130 degrees. For example, the method can be used to manufacture the crystal device 210.

Please refer to FIGS. 6, 8A, 8B and 8C. In some embodiments, the first conductive seat 320 has a conductive surface SD1. Each of the first and the second reference target areas K11 and K12, and the first, the second and the third conductive adhesives W11, W12 and W13 is at least partly disposed on the conductive surface SD1. For example, the conductive surface SD1 is a top surface. Each of the first, the second and the third conductive adhesives W11, W12 and W13 is at least partly disposed between the conductive surface SD1 and the first extension electrode 440, and is electrically connected to the conductive surface SD1 and the first extension electrode 440. The principal reference plane QU1 faces the conductive surface SD1.

The second conductive seat 340 has a conductive surface SD2. For example, the conductive surface SD2 is a top surface. Each of the third and the fourth reference target areas K21 and K22, the third conductive adhesive W21, the fourth conductive adhesive W22 and the conductive adhesive W23 is at least partly disposed on the conductive surface SD2. Each of the third conductive adhesive W21, the fourth conductive adhesive W22 and the conductive adhesive W23 is at least partly disposed between the conductive surface SD2 and the second extension electrode 460, and is electrically connected to the conductive surface SD2 and the second extension electrode 460. For example, the integrated chip 400 has a length, a width, a thickness and a quasi-cuboid (or a quasi-rectangular-parallelepiped); the thickness is less than the width; and the width is less than the length. The quasi-cuboid has a body shape. The principal reference plane QU1 faces the conductive surface SD2, and is determined according to the body shape of the quasi-cuboid.

For example, the bearing base 300 further includes an insulation base body 310. Each of the first and the second conductive seats 320 and 340 is at least partly disposed in the insulation base body 310. The insulation base body 310 includes a support platform 370. The integrated chip 400 has a first side portion 401 and a second side portion 402 opposite to the first side portion 401. The first conductive adhesive W11, the second conductive adhesive W12, the third conductive adhesive W21, the fourth conductive adhesive W22, the third conductive adhesive W13, and the conductive adhesive W23 are used to support the first side portion 401. The support platform 370 is used to support the second side portion 402.

In some embodiments, each of the first conductive adhesive W11, being in the relatively low hardened state SH1, and the second conductive adhesive W12, being in the relatively low hardened state SH1, is provided by using an adhesive dispensing element 92. For example, the adhesive dispensing element 92 is an adhesive dispensing needle. Under a condition that the adhesive dispensing element 92 is caused to align with the first reference position F11 by referring to the first reference position F11, the first reference target area K11 receives from the adhesive dispensing element 92 the first conductive adhesive W11 being in the relatively low hardened state SH1. Under a condition that the adhesive dispensing element 92 is caused to align with the second reference position F12 by referring to the second reference position F12, the second reference target area K12 receives from the adhesive dispensing element 92 the second conductive adhesive W12 being in the relatively low hardened state SH1.

Each of the third conductive adhesive W21, being in the relatively low hardened state SH1, and the fourth conductive adhesive W22, being in the relatively low hardened state SH1, is provided by using the adhesive dispensing element 92. Under a condition that the adhesive dispensing element 92 is made to align with the third reference position F21 by referring to the third reference position F21, the third reference target area K21 receives from the adhesive dispensing element 92 the third conductive adhesive W21 being in the relatively low hardened state SH1. Under a condition that the adhesive dispensing element 92 is made to align with the fourth reference position F22 by referring to the fourth reference position F22, the fourth reference target area K22 receives from the adhesive dispensing element 92 the fourth conductive adhesive W22 being in the relatively low hardened state SH1.

The third conductive adhesive W21 is contiguous with or separate from the fourth conductive adhesive W22. The third reference target area K21 is intersected with or separate from the fourth reference target area K22. The third reference target area K21 receives at an operation time T21 the third conductive adhesive W21 being in the relatively low hardened state SH1. The fourth reference target area K22 receives at an operation time T22 the fourth conductive adhesive W22 being in the relatively low hardened state SH1. For example, the second operation time T12 is the same as or different from the first operation time T11. The operation time T22 is the same as or different from the operation time T21. Under a condition that the operation time T22 is different from the operation time T21, the operation times T21 and T22 have a time interval HT2 therebetween. The time interval HT2 ranges from 0.1 second to 1.0 second.

Each of the third conductive adhesive W13, being in the relatively low hardened state SH1, and the conductive adhesive W23, being in the relatively low hardened state SH1, is provided by using the adhesive dispensing element 92. Under a condition that the adhesive dispensing element 92 is made to align with the third reference position F13 by referring to the third reference position F13, the third reference target area K13 receives from the adhesive dispensing element 92 the third conductive adhesive W13 being in the relatively low hardened state SH1. Under a condition that the adhesive dispensing element 92 is made to align with the reference position F23 by referring to the reference position F23, the reference target area K23 receives from the adhesive dispensing element 92 the conductive adhesive W23 being in the relatively low hardened state SH1.

For example, the first reference target area K11, the second reference target area K12, the third reference target area K21, the fourth reference target area K22, the third reference target area K13 and the reference target area K23 are respectively located at the first reference position F11, the second reference position F12, the third reference position F21, the fourth reference position F22, the third reference position F13 and the reference position F23. Each of the integrated chip 400, the first conductive adhesive W11, the second conductive adhesive W12, the third conductive adhesive W21, the fourth conductive adhesive W22, the third conductive adhesive W13 and the conductive adhesive W23 is disposed in the containment space VC1.

In some embodiments, the adhesive dispensing element 92 is coupled to a controller 650, and is controlled by the controller 650. The first reference position F11, the second reference position F12, the third reference position F21, the fourth reference position F22, the third reference position F13 and the reference position F23 are respectively represented by a first reference position data, a second reference position data, a third reference position data, a fourth reference position data, a fifth reference position data and a sixth reference position data. The controller 650 is configured to obtain the first, the second, the third, the fourth, the fifth and the sixth reference position data.

The controller 650 causes the adhesive dispensing element 92 to align with the first reference position F11 according to the obtained first reference position data, and thereby causes the first reference target area K11 to receive the first conductive adhesive W11 being in the relatively low hardened state SH1 according to the obtained first reference position data. The controller 650 causes the adhesive dispensing element 92 to align with the second reference position F12 according to the obtained second reference position data, and thereby causes the second reference target area K12 to receive the second conductive adhesive W12 being in the relatively low hardened state SH1 according to the obtained second reference position data.

The controller 650 causes the adhesive dispensing element 92 to align with the third reference position F21 according to the obtained third reference position data, and thereby causes the third reference target area K21 to receive the third conductive adhesive W21 being in the relatively low hardened state SH1 according to the obtained third reference position data. The controller 650 causes the adhesive dispensing element 92 to align with the fourth reference position F22 according to the obtained fourth reference position data, and thereby causes the fourth reference target area K22 to receive the fourth conductive adhesive W22 being in the relatively low hardened state SH1 according to the obtained fourth reference position data.

The controller 650 causes the adhesive dispensing element 92 to align with the third reference position F13 according to the obtained fifth reference position data, and thereby causes the third reference target area K13 to receive the third conductive adhesive W13 being in the relatively low hardened state SH1 according to the obtained fifth reference position data. The controller 650 causes the adhesive dispensing element 92 to align with the reference position F23 according to the obtained sixth reference position data, and thereby causes the reference target area K23 to receive the conductive adhesive W23 being in the relatively low hardened state SH1 according to the obtained sixth reference position data.

For example, the second conductive seat 340, the third reference target area K21, the fourth reference target area K22, the reference target area K23, the third reference position F21, the fourth reference position F22, the reference position F23, the third conductive adhesive W21, the fourth conductive adhesive W22, the conductive adhesive W23, the third geometric center C21, the fourth geometric center C22 and the geometric center C23 respectively correspond to or match with the first conductive seat 320, the first reference target area K11, the second reference target area K12, the third reference target area K13, the first reference position F11, the second reference position F12, the third reference position F13, the first conductive adhesive W11, the second conductive adhesive W12, the third conductive adhesive W13, the first geometric center C11, the second geometric center C12 and the third geometric center C13.

In some embodiments, any of the crystal devices 200 and 210 includes a ceramic substrate, the crystal chip, and the extension electrodes disposed on the crystal chip. Any of the crystal devices 200 and 210 performs a multi-edge bonding on the extension electrodes and the crystal chip by using at least two conductive adhesives. Any of the crystal devices 200 and 210 may better capture vibration energy, may enhance the support intensity of the integrated chip, and may sufficiently satisfy the characteristic requirement of the anti-drop for a mobile device. Under a condition that the first specific angle A11 is equal to a first representative angle: the first conductive adhesive W11 and the integrated chip 400 have a first contact area therebetween, and the second conductive adhesive W12 and the integrated chip 400 have a second contact area therebetween. For example, the first representative angle is equal to 45 degrees.

Under a condition that the first specific angle A11 is different from the first representative angle: a third contact area between the first conductive adhesive W11 and the integrated chip 400 can be different from the first contact area, and a fourth contact area between the second conductive adhesive W12 and the integrated chip 400 can be different from the second contact area. Therefore, a contact area between the first conductive adhesive W11 and the integrated chip 400 can be adjusted by adjusting the first specific angle A11. A contact area between the second conductive adhesive W12 and the integrated chip 400 can be adjusted by adjusting the first specific angle A11.

Figure 10A:
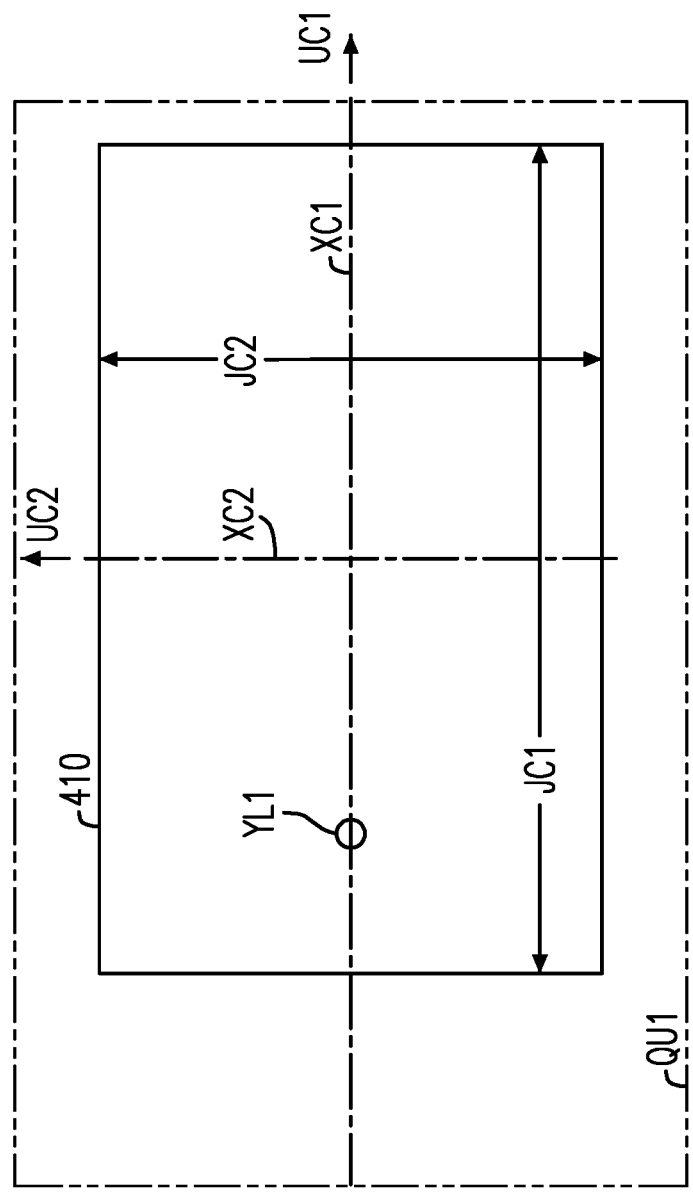
FIG. 10A is a schematic diagram showing a top view of a crystal chip of the crystal device shown in FIG. 4A.
Figure 10B:
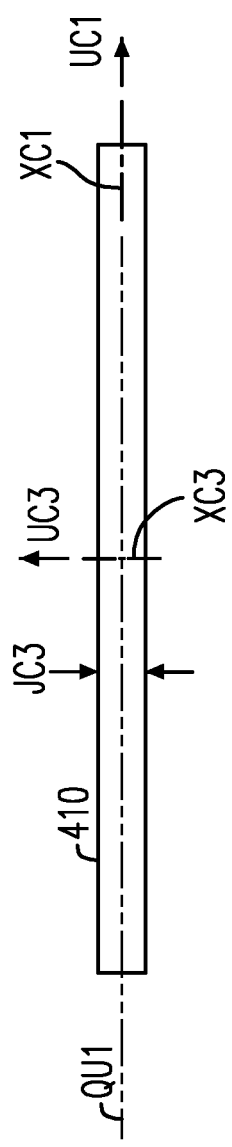
FIG. 10B is a schematic diagram showing a front view of the crystal chip shown in FIG. 10A.

Please refer to FIG. 10A and FIG. 10B. FIG. 10A is a schematic diagram showing a top view of a crystal chip 410 of the crystal device 200 shown in FIG. 4A. FIG. 10B is a schematic diagram showing a front view of the crystal chip 410 shown in FIG. 10A. As shown in FIGS. 10A and 10B, the crystal chip 410 has a first principal axis XC1, a second principal axis XC2 and a third principal axis XC3, which are mutually perpendicular. The first, the second and the third principal axes XC1, XC2 and XC3 respectively have a first principal axis direction UC1, a second principal axis direction UC2 and a third principal axis direction UC3.

The crystal chip 410 has a body shape, a length JC1 being in the first principal axis direction UC1, a width JC2 being in the second principal axis direction UC2, and a thickness JC3 being in the third principal axis direction UC3. The length JC1 is longer than the width JC2. The width JC2 is longer than the thickness JC3. The first principal axis XC1 is the same as the first major axis YL1. For example, the principal reference plane QU1 includes the first principal axis XC1 and the second principal axis XC2. Each of the first, the second and the third principal axes XC1, XC2 and XC3 is determined according to the body shape of the crystal chip 410.

Figure 11A:
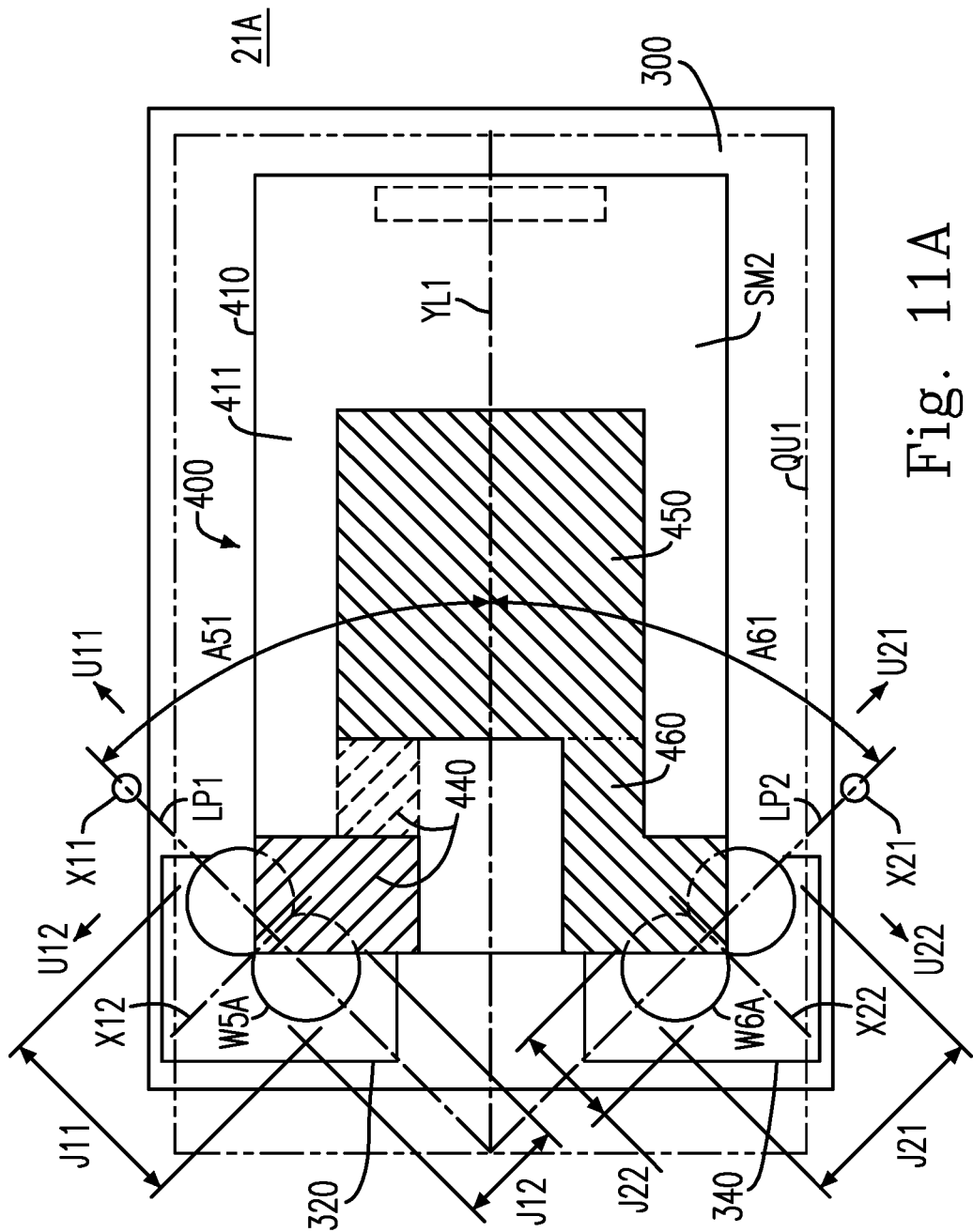
FIG. 11A is a schematic diagram showing a top view of an implementation structure of the crystal device shown in FIG. 7A.
Figure 11B:
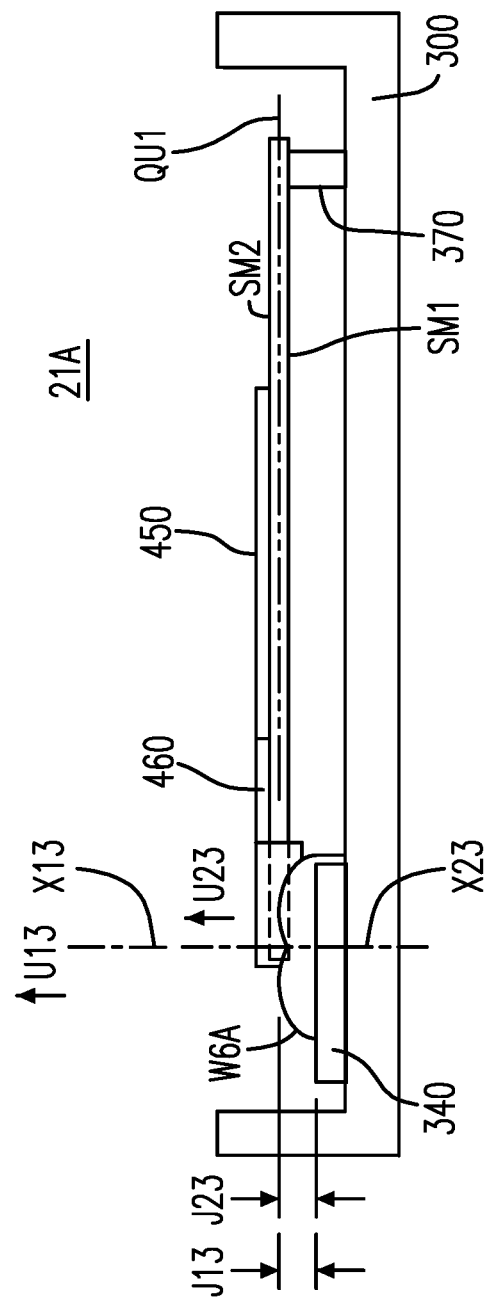
FIG. 11B is a schematic diagram showing a front view of the implementation structure shown in FIG. 11A.

Please refer to FIG. 11A and FIG. 11B. FIG. 11A is a schematic diagram showing a top view of an implementation structure 21A of the crystal device 210 shown in FIG. 7A. FIG. 11B is a schematic diagram showing a front view of the implementation structure 21A shown in FIG. 11A. As shown in FIGS. 11A and 11B, the crystal device 210 includes the bearing base 300, the integrated chip 400, the first conductive adhesive unit W5A and the second conductive adhesive unit W6A.

In some embodiments, the first conductive adhesive unit W5A being in the relatively high hardened state SH2 has a first principal axis X11, a second principal axis X12 and a third principal axis X13, which are mutually perpendicular. The first, the second and the third principal axes X11, X12 and X13 respectively have a first principal axis direction U11, a second principal axis direction U12 and a third principal axis direction U13. The first conductive adhesive unit W5A being in the relatively high hardened state SH2 has a length J11 being in the first principal axis direction U11, a width J12 being in the second principal axis direction U12, and a thickness J13 being in the third principal axis direction U13. The length J11 is longer than the width J12. The width J12 is longer than the thickness J13. The first principal axis X11 is the same as the second major axis YW1. The first aspect ratio AR1 is equal to a ratio of the length J11 to the width J12, and is determined according to a body shape of the first conductive adhesive unit W5A being in the relatively high hardened state SH2.

The second conductive adhesive unit W6A being in the relatively high hardened state SH2 has a first principal axis X21, a second principal axis X22 and a third principal axis X23, which are mutually perpendicular. The first, the second and the third principal axes X21, X22 and X23 respectively have a first principal axis direction U21, a second principal axis direction U22 and a third principal axis direction U23. The second conductive adhesive unit W6A being in the relatively high hardened state SH2 has a length J21 being in the first principal axis direction U21, a width J22 being in the second principal axis direction U22, and a thickness J23 being in the third principal axis direction U23. The length J21 is longer than the width J22. The width J22 is longer than the thickness J23. The first principal axis X21 is the same as the third major axis YW2. The second aspect ratio AR2 is equal to a ratio of the length J21 to the width J22, and is determined according to a body shape of the second conductive adhesive unit W6A being in the relatively high hardened state SH2.

Figure 12:
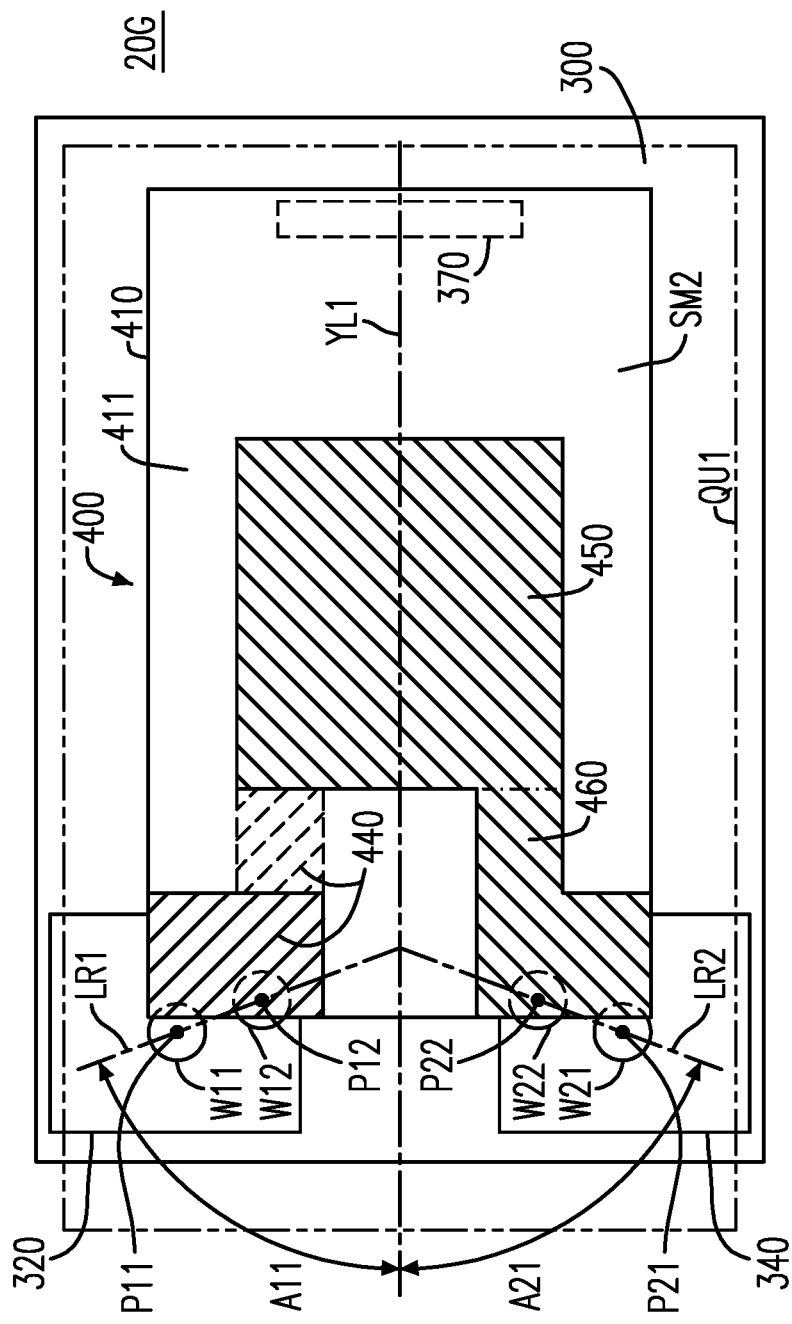
FIG. 12 is a schematic diagram showing a top view of an implementation structure of the crystal device shown in FIG. 2A.
Figure 13:
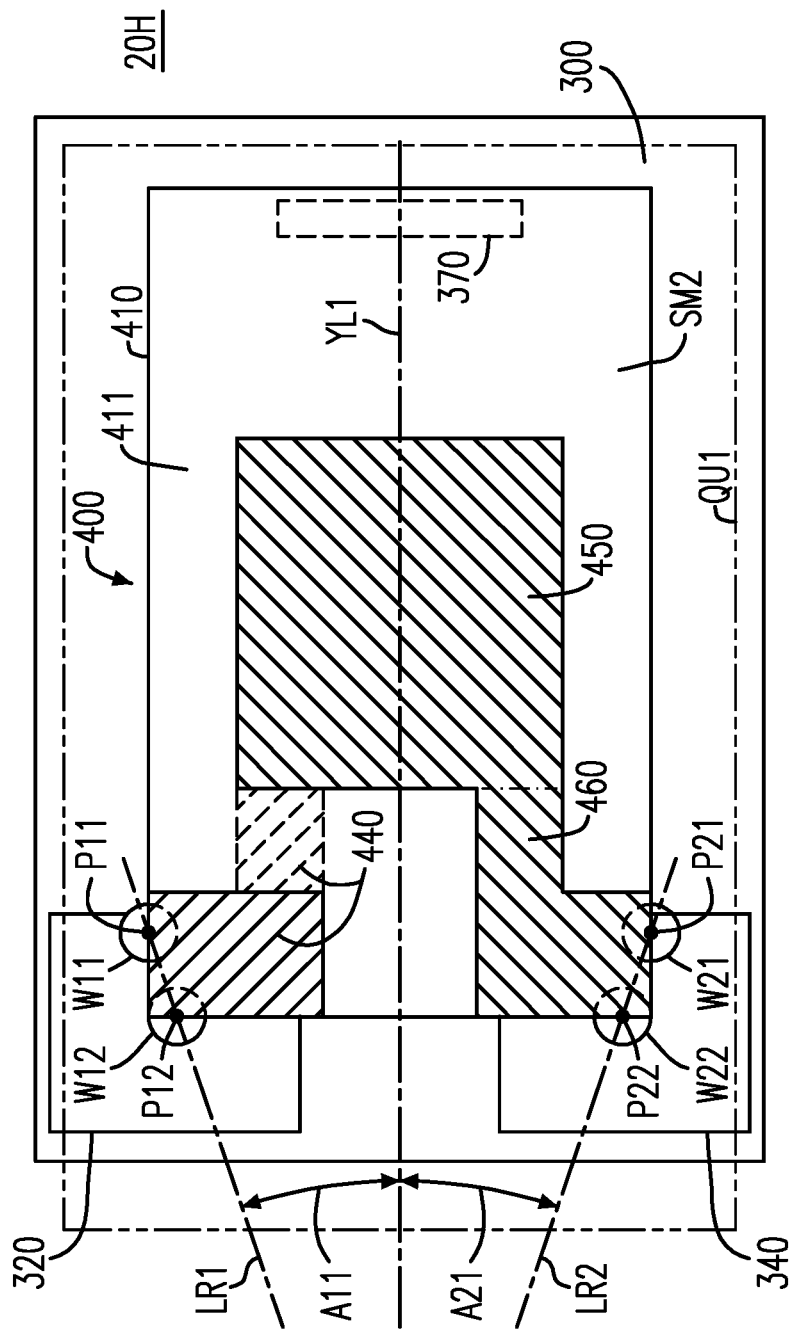
FIG. 13 is a schematic diagram showing a top view of an implementation structure of the crystal device shown in FIG. 2A.
Figure 14:
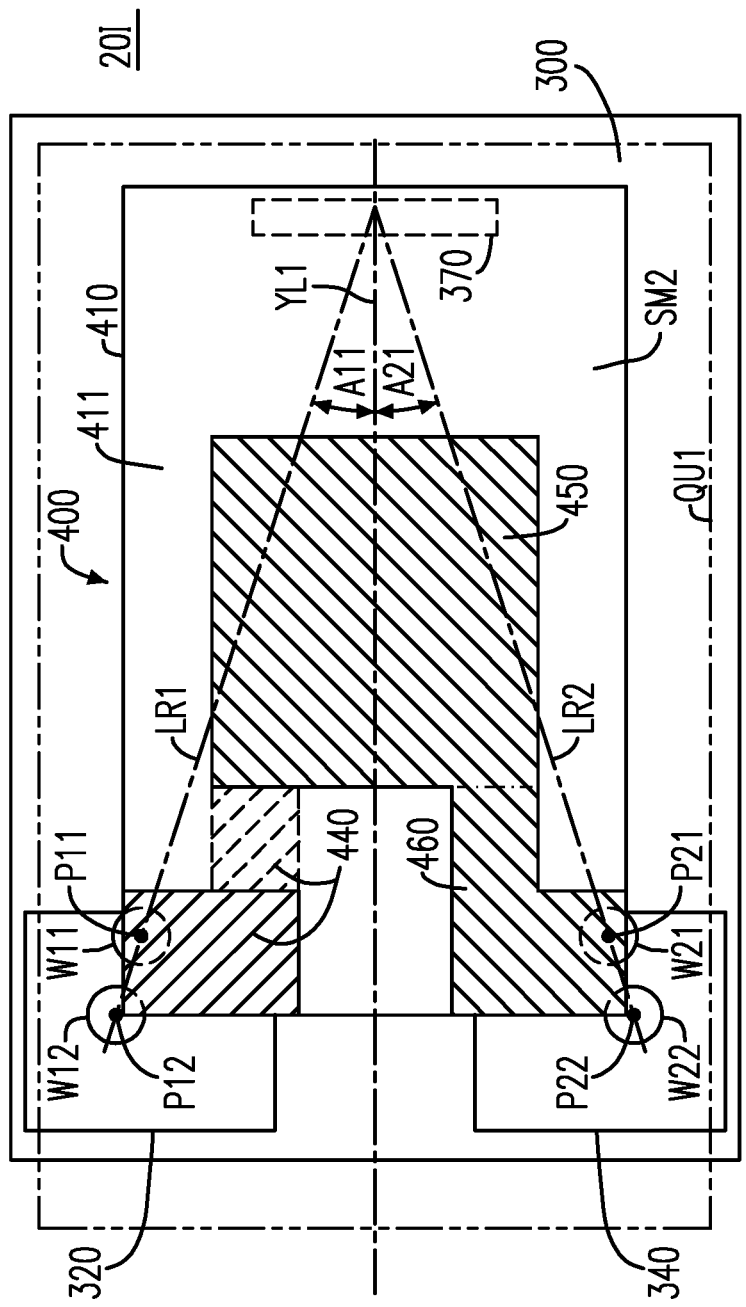
FIG. 14 is a schematic diagram showing a top view of an implementation structure of the crystal device shown in FIG. 2A.

Please refer to FIG. 12, FIG. 13 and FIG. 14. FIG. 12 is a schematic diagram showing a top view of an implementation structure 20G of the crystal device 200 shown in FIG. 2A. FIG. 13 is a schematic diagram showing a top view of an implementation structure 20H of the crystal device 200 shown in FIG. 2A. FIG. 14 is a schematic diagram showing a top view of an implementation structure 20I of the crystal device 200 shown in FIG. 2A. As shown in FIGS. 12, 13 and 14, each of the implementation structures 20G, 20H and 20I includes the bearing base 300, the integrated chip 400, and the first, the second, the third and the fourth conductive adhesives W11, W12, W21 and W22.

As shown in FIGS. 12 and 4A, each of the first and the second conductive adhesives W11 and W12 included in the implementation structure 20G is in contact with the second edge portion 442 of the first extension electrode 440. Each of the third and the fourth conductive adhesives W21 and W22 included in the implementation structure 20G is in contact with the second edge portion 462 of the second extension electrode 460. In the implementation structure 20G, each of the first and the second specific angles A11 and A21 ranges from 0 degree to 90 degrees.

As shown in FIGS. 13 and 4A, the first conductive adhesive W11 included in the implementation structure 20H is in contact with the first edge portion 441 of the first extension electrode 440. The second conductive adhesive W12 included in the implementation structure 20H is in contact with the second edge portion 442 of the first extension electrode 440. The third conductive adhesive W21 included in the implementation structure 20H is in contact with the first edge portion 461 of the second extension electrode 460. The fourth conductive adhesive W22 included in the implementation structure 20H is in contact with the second edge portion 462 of the second extension electrode 460. In the implementation structure 20H, each of the first and the second specific angles A11 and A21 ranges from 0 degree to 90 degrees.

As shown in FIGS. 14 and 4A, the first conductive adhesive W11 included in the implementation structure 20I is in contact with the first edge portion 441 of the first extension electrode 440. The second conductive adhesive W12 included in the implementation structure 20I is in contact with the first and the second edge portions 441 and 442 of the first extension electrode 440. The third conductive adhesive W21 included in the implementation structure 20I is in contact with the first edge portion 461 of the second extension electrode 460. The fourth conductive adhesive W22 included in the implementation structure 20I is in contact with the first and the second edge portions 461 and 462 of the second extension electrode 460. In the implementation structure 20I, each of the first and the second specific angles A11 and A21 ranges from 0 degree to 90 degrees. For example, the first specific angles A11 and B11, the second specific angles A12, A1A, A21, B12 and B21, the third specific angles A13 and B13, the specific angles A1A, A22, A23, A2A and B2A, the first practical angle A51, and the second practical angle A61 are a plurality of included angles respectively.

Figure 15:
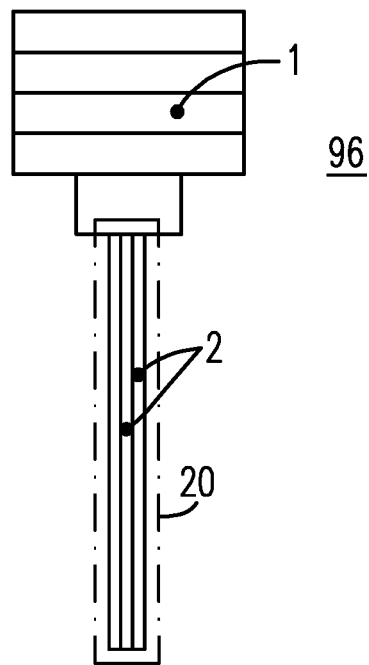
FIG. 15 is a schematic diagram showing a front view of an adhesive dispensing needle according to various embodiments of the present disclosure.
Figure 16:
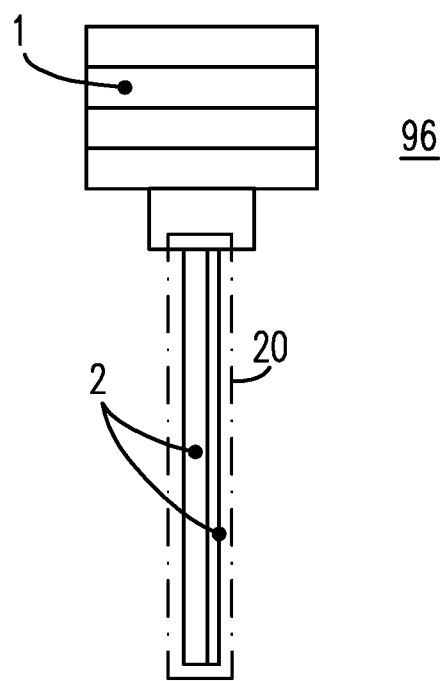
FIG. 16 is a schematic diagram showing a side view of the adhesive dispensing needle shown in FIG. 15.

Please refer to FIG. 15 and FIG. 16. FIG. 15 is a schematic diagram showing a front view of an adhesive dispensing needle 96 according to various embodiments of the present disclosure. FIG. 16 is a schematic diagram showing a side view of the adhesive dispensing needle 96 shown in FIG. 15. As shown in FIGS. 15 and 16, the adhesive dispensing needle 96 is used to manufacture a quartz crystal resonator, is a specific adhesive dispensing needle, and includes an adhesive providing head 1 and an adhesive dispensing head 20. The adhesive dispensing head 20 has a structure, which includes two circular needle pipes 2. The two circular needle pipes 2 are adjacent, are disposed in parallel, and form an adhesive dispensing channel. The adhesive dispensing channel has a cross-sectional area forming a calabash gourd shape.

The two circular needle pipes 2 respectively have two inner diameters M and N, wherein N<M, 0.1 mm≤M≤0.25 mm, and 0.08 mm≤N≤0.2 mm. In some embodiments, under a condition that the two circular needle pipes 2 are merged to form a specific circular needle pipe, the adhesive dispensing needle 96 can be used to manufacture the crystal device 200.

Figure 17:
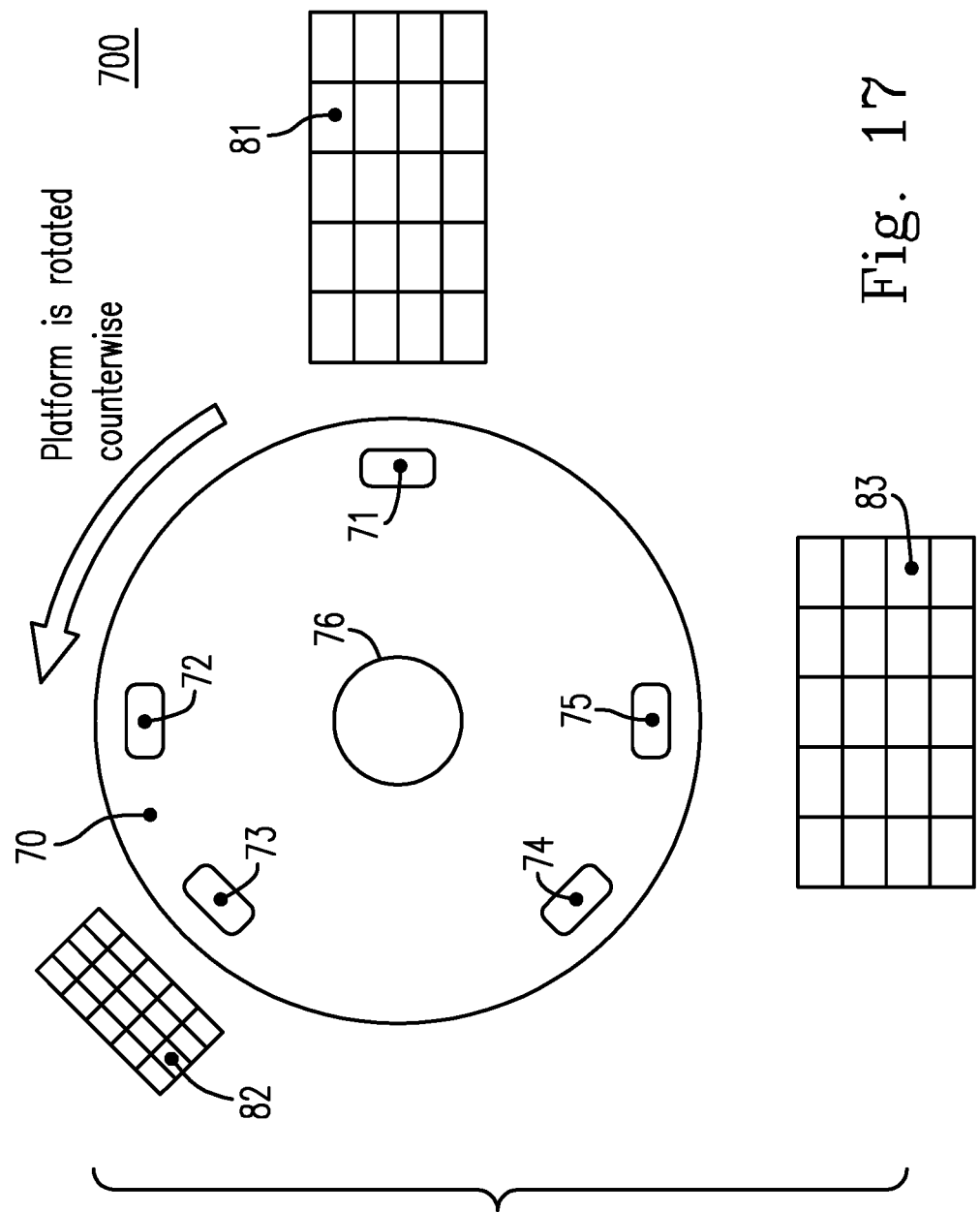
FIG. 17 is a schematic structural diagram showing a manufacturing system according to various embodiments of the present disclosure.
Figure 18:
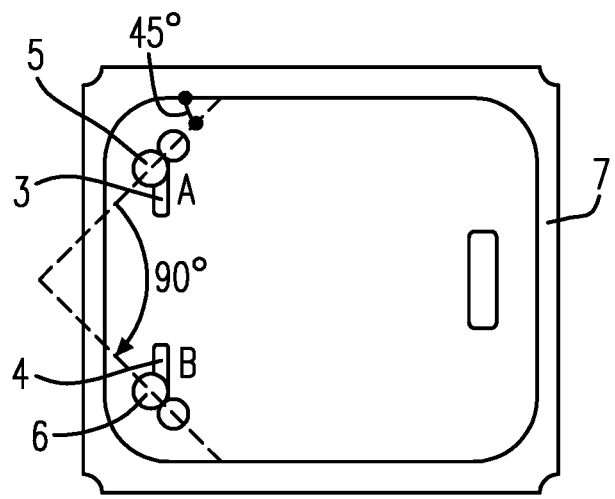
FIG. 18 is a schematic diagram showing a product structure after an adhesive dispensing operation for a lower layer is performed according to various embodiments of the present disclosure.
Figure 19:
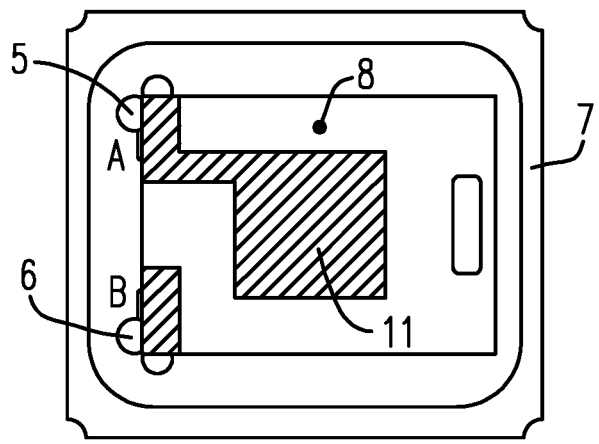
FIG. 19 is a schematic diagram showing a product structure after a chip disposing operation is performed according to various embodiments of the present disclosure.
Figure 20:
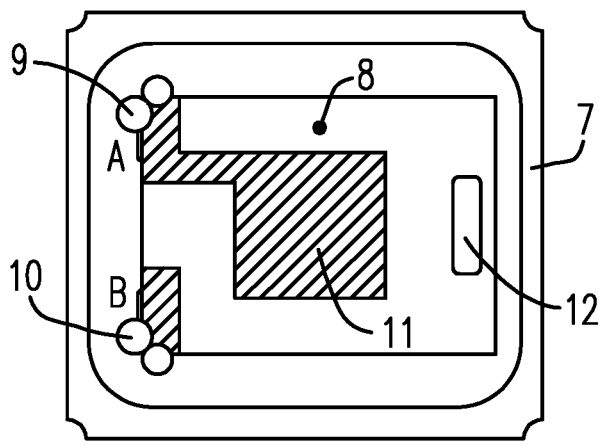
FIG. 20 is a schematic diagram showing a product structure after an adhesive dispensing operation for an upper layer is performed according to various embodiments of the present disclosure.

Please refer to FIG. 17, FIG. 18, FIG. 19 and FIG. 20. FIG. 17 is a schematic structural diagram showing a manufacturing system 700 according to various embodiments of the present disclosure. FIG. 18 is a schematic diagram showing a product structure after an adhesive dispensing operation for a lower layer is performed according to various embodiments of the present disclosure. FIG. 19 is a schematic diagram showing a product structure after a chip disposing operation is performed according to various embodiments of the present disclosure. FIG. 20 is a schematic diagram showing a product structure after an adhesive dispensing operation for an upper layer is performed according to various embodiments of the present disclosure.

As shown in FIG. 17, the manufacturing system 700 is an adhesive dispensing system, and includes a bearing platform 70, a bottom-case source-material area 81, a chip source-material area 82, a material-output holding area 83 and a defective product disposal case 76. The bearing platform 70 is associated with a bottom-case feed position 71, an adhesive dispensing position 72 for lower dispensing, a chip feed position 73, an adhesive dispensing position 74 for upper dispensing, and a position 75 for charge coupling device (CCD) recognition and material output. For example, the bearing platform 70 is a rotational bearing vacuum platform, and has a specific operation position 69.

As shown in FIGS. 17-20, the specific adhesive dispensing method of the quartz crystal resonator provided in the present embodiment includes the following steps: a material-feed operation, an adhesive dispensing operation for a lower layer, a chip disposing operation, an adhesive dispensing operation for an upper layer, and a charge coupling device (CCD) check.

The material-feed operation is described as follows: A mechanical gripping jaw (not shown) is provided. The mechanical gripping jaw grips the source material bottom case 7, and then positions the source material bottom case 7 to the adhesive dispensing position 72 being on the rotational bearing vacuum platform. As shown in FIG. 17, the top surface of the bearing platform 70 has the bottom-case feed position 71, the adhesive dispensing position 72 for lower dispensing, the chip feed position 73, the adhesive dispensing position 74 for upper dispensing, and the position 75 for charge coupling device recognition and material output, which are sequentially disposed in a counterclockwise direction. There is the defective product disposal case 76 disposed at the center position of the bearing platform 70. The bearing platform 70 is controlled to cause the specific operation position 69 to reach the bottom-case feed position 71. The mechanical gripping jaw grips the source material bottom case 7, and then positions the source material bottom case 7 to the bottom-case feed position 71 (or the specific operation position 69). The bearing platform 70 is rotated 90 degrees in the counterclockwise direction so as to position the source material bottom case 7 to the adhesive dispensing position 72 for lower dispensing.

The adhesive dispensing operation for the lower layer is described as follows: As shown in FIG. 18, the source material bottom case 7 includes a side portion, which has two end portions. The source material bottom case 7 further includes a conductive platform (or a conductive seat) 3 (A) and a conductive platform (or a conductive seat) 4 (B), which are respectively disposed in the two end portions, and are respectively located at a first specific position and a second specific position. A moving mechanism (not shown) for adhesive dispensing is provided, is coupled to the adhesive dispensing head 20, and is made to move the adhesive dispensing head 20 to the first specific position. The adhesive dispensing head 20 has a first variable height at the first specific position. When the adhesive dispensing head 20 is located at the first specific position, the moving mechanism causes the adhesive dispensing head 20 to move downwards in the direction of a Z adhesive dispensing axis to cause the first variable height to be equal to a first specific height by using an infra-red detection. An adhesive dispensing controller (not shown) is provided, and is coupled to the adhesive dispensing head 20 controlled by the adhesive dispensing controller. When the first variable height is made to be equal to the first specific height, the adhesive dispensing controller receives a trigger signal. The adhesive dispensing controller controls an adhesive dispensing pressure, an adhesive dispensing speed and an adhesive dispensing time in response to the trigger signal, and thereby causes the adhesive dispensing head 20 to dispense a lower adhesive point 5 (A) having a calabash gourd shape.

The moving mechanism is made to move along the direction of an X adhesive dispensing axis, and thereby cause the adhesive dispensing head 20 to move to the second specific position. The adhesive dispensing head 20 has a second variable height at the second specific position. When the adhesive dispensing head 20 is located at the second specific position, the moving mechanism drives the adhesive dispensing head 20 to rotate an angle of 90 degrees, and then causes the adhesive dispensing head 20 to move downwards in the direction of a Z adhesive dispensing axis to cause the second variable height to be equal to a second specific height. When the second variable height is made to be equal to the second specific height, the adhesive dispensing controller controls an adhesive dispensing pressure, an adhesive dispensing speed and an adhesive dispensing time, and thereby causes the adhesive dispensing head 20 to dispense a lower adhesive point 6 (B).

The chip disposing operation is described as follows: As shown in FIGS. 17 and 19, the bearing platform 70 is rotated 60 degrees in the counterclockwise direction so as to position the source material bottom case 7 to the chip feed position 73 (or to cause the specific operation position 69 to reach the chip feed position 73). The mechanical gripping jaw grips the chip 8, and disposes the gripped chip 8 onto both of the lower adhesive point 5 (A) and the lower adhesive point 6 (B). As shown in FIG. 19, a medium (shown as a cross-sectional line area) forming a layer and attached on the chip 8 is an electrode 11.

The adhesive dispensing operation for the upper layer is described as follows: As shown in FIGS. 17 and 20, the bearing platform 70 is rotated 60 degrees in the counter-clockwise direction so as to position the source material bottom case 7 to the upper adhesive dispensing position 74 for upper dispensing (or to cause the specific operation position 69 to reach the adhesive dispensing position 74). When the adhesive dispensing head 20 is located at the first specific position, the moving mechanism causes the adhesive dispensing head 20 to move downwards in the direction of a Z adhesive dispensing axis to cause the first variable height to be equal to a first specific height by using an infra-red detection. When the first variable height is made to be equal to the first specific height, the adhesive dispensing controller receives a trigger signal. The adhesive dispensing controller controls an adhesive dispensing pressure, an adhesive dispensing speed and an adhesive dispensing time in response to the trigger signal, and thereby causes the adhesive dispensing head 20 to dispense an upper adhesive point 9 (A).

The moving mechanism is made to move along the direction of an X adhesive dispensing axis, and thereby cause the adhesive dispensing head 20 to move to the second specific position. When the adhesive dispensing head 20 is located at the second specific position, the moving mechanism drives the adhesive dispensing head 20 to rotate an angle of 90 degrees, and then causes the adhesive dispensing head 20 to move downwards in the direction of a Z adhesive dispensing axis to cause the second variable height to be equal to a second specific height. When the second variable height is made to be equal to the second specific height, the adhesive dispensing controller controls an adhesive dispensing pressure, an adhesive dispensing speed and an adhesive dispensing time, and thereby causes the adhesive dispensing head 20 to dispense an upper adhesive point 10 (B), so that a product is formed.

The charge coupling device (CCD) check is described as follows: As shown in FIG. 17, the bearing platform 70 is rotated 60 degrees in the counterclockwise direction so as to position the source material bottom case 7 to the position 75 for charge coupling device recognition and material output (or to cause the specific operation position 69 to reach the position 75). The lower adhesive points 5 (A) and 6 (B), and the upper adhesive points 9 (A) and 10 (B) have adhesive point magnitudes and adhesive point angles. The adhesive point magnitudes and the adhesive point angles are recognized at the position 75. There is an adhesive dispensing template stored well on a master element. An electronic optical image of the product is obtained. An image recognition and comparison is performed on the electronic optical image. The electronic optical image is compared with the adhesive dispensing template. The adhesive point magnitudes and the adhesive point angles are checked to give a check score. The check score is compared with a target score. Under a condition that the check score is greater than the target score, the product passes. Under a condition that the check score is less than the target score, the product is gripped to be thrown into the defective product disposal case 76.

In the adhesive dispensing process provided in the present disclosure, it is necessary to make a structure design of a specific adhesive dispensing needle and to make an adjust control to the angle of the specific adhesive dispensing needle. Because the adhesive dispensing head 20 provided in the present disclosure is formed by combining the two circular needle pipes 2, the adhesive dispensing head 20 has a cross-sectional area with a calabash gourd shape. Therefore, as shown in FIG. 18, when the adhesive dispensing needle 96 is installed to the adhesive dispensing mechanism, it is necessary that an angle of 45 degrees is included by the center line of the adhesive dispensing needle 96 and an edge of the source material bottom case 7 being in the width direction. The conventional adhesive dispensing needle has an adhesive dispensing terminal, which has a shape of a single circular pipe. Therefore, it is unnecessary for the conventional adhesive dispensing needle to employ an angle control. In general, the inner diameter of the conventional adhesive dispensing needle ranges from 0.15 mm to 0.3 mm. Each of the two inner diameters of the two circular needle pipes 2 provided in the present disclosure is less than the inner diameters of the conventional adhesive dispensing needle, so that the adhesive dispensing needle 96 can effectively prevent the problem that the product impedance increases due to an increase of the contact area of the adhesive point.

The adhesive dispensing method provided in the present disclosure uses two adhesive points of a calabash gourd shape, and thus may ensure that each of the two adjacent corner of the chip 8 can be covered with a silver adhesive, thereby taking the effect of enhancing the adhesive force between the chip 8 and a ceramic bottom case of the source material bottom case 7. Under a condition that the new adhesive dispensing method provided in the present disclosure is employed, even when the new adhesive dispensing method is applied to the relatively low frequency product or is used by a customer having a specific applied-force technique, the new adhesive dispensing method can effectively prevent the problem that the chip 8 falls off or the adhesive point splits. Compared with the conventional adhesive dispensing technique, the new adhesive dispensing scheme provided in the present disclosure has the following features: The needle head shape of the adhesive dispensing needle is re-designed. A new adhesive dispensing method of 4 adhesive points is employed, and may achieve the effect of resisting the external force caused by the adhesive dispensing method of 5/6 adhesive points, thereby raising the production efficiency of the chip uploading process for adhesive dispensing. Compared with the conventional adhesive dispensing method of 5/6 adhesive points, the new adhesive dispensing method of 4 adhesive points raises the impedance value performance of the product.

The adhesive dispensing product provided in the present disclosure has the following design principle:

The chip 8 is a main component used to cause the quartz crystal resonator to oscillate. The electrode 11 is a medium (in general, it is made of a silver or a gold) forming a layer and attached on the chip 8, and has an area and a thickness. The area and the thickness of the electrode 11 are used to determine a specific frequency of the crystal chip 8. A silver adhesive dispensed by the adhesive dispensing needle 96 is used to fix the chip 8 in one aspect, and is used to perform a conduction of a signal in another aspect, wherein the signal is transmitted through the electrode 11 on the chip 8, the silver adhesive and the source material bottom case 7 (including the ceramic bottom case). The conductive platform is conveniently used by the adhesive dispensing machine to perform an image position recognition to precisely perform an adhesive dispensing in one aspect, and is used for the conduction of the signal, wherein the signal is transmitted through the electrode 11, the silver adhesive, the conductive platform of the source material bottom case 7 (including the ceramic bottom case).

The source material bottom case 7 further has a support platform 12 extending from the ceramic bottom case. The support platform 12 can serve to support the chip 8 through a fifth adhesive point for holding the chip 8 only when an adhesive dispensing method of 5 adhesive points is employed. The source material bottom case 7 including the ceramic bottom case mainly serves to transmit an external signal, to protect the inner structure of the product, and to bear the chip 8.

The beneficial effect provided in the present disclosure is described as follows:

Each of the two inner diameters of the two circular needle pipes 2 provided in the present disclosure is less than the inner diameter of the conventional adhesive dispensing needle, so that the adhesive dispensing needle 96 can effectively prevent the problem that the product impedance increases due to an increase of the contact area of the adhesive point. The adhesive dispensing method provided in the present disclosure uses two calabash-gourd-shape adhesive points, and thus may ensure that each of the two adjacent corners of the chip 8 can be covered with a silver adhesive, thereby taking the effect of enhancing the adhesive force between the chip 8 and a ceramic bottom case of the source material bottom case 7.

Under a condition that the new adhesive dispensing method provided in the present disclosure is employed, even when the new adhesive dispensing method is applied to the relatively low frequency product or is used by a customer having a specific applied-force technique, the new adhesive dispensing method can effectively prevent the problem that the chip 8 falls off or the adhesive point splits. Compared with the conventional adhesive dispensing technique, the new adhesive dispensing scheme provided in the present disclosure has the following features: The needle head shape of the adhesive dispensing needle is re-designed. A new adhesive dispensing method of 4 adhesive points is employed, and may achieve the effect of resisting the external force caused by the adhesive dispensing method of 5/6 adhesive points, thereby raising the production efficiency of the chip uploading process for adhesive dispensing. Compared with the adhesive dispensing method of 5/6 adhesive points, the new adhesive dispensing method of 4 adhesive points raises the impedance value performance of the product.

While the invention has been described in terms of what is presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A crystal device, comprising:
   a bearing base including a first conductive seat;
   an integrated chip including a principal reference plane facing the first conductive seat, and having a first major axis;
   a first conductive adhesive having a first geometric center, and at least partly disposed between the first conductive seat and the integrated chip; and
   a second conductive adhesive having a second geometric center, and at least partly disposed between the first conductive seat and the integrated chip, wherein:
   the principal reference plane further has a first perpendicular projection position defined according to the first geometric center, a second perpendicular projection position defined according to the second geometric center, and a first reference straight line passing through the first and the second perpendicular projection positions; and
   a first specific angle is included by the first reference straight line and the first major axis, and ranges from 0 degree to 90 degrees.

2. The crystal device according to claim 1, wherein:
   the first conductive adhesive is separate from the second conductive adhesive; and
   the first and the second conductive adhesives respectively have a first body volume and a second body volume.

3. The crystal device according to claim 1, being a quartz crystal resonator, wherein:
   the first and the second conductive adhesives are merged to form a conductive adhesive unit having a second major axis and an aspect ratio ranging from 1.1 to 1.9;
   the principal reference plane further has a perpendicular projection straight line defined according to the second major axis; and
   a practical angle is included by the perpendicular projection straight line and the first major axis, and ranges from 0 degree to 90 degrees.

4. The crystal device according to claim 1, further comprising a third conductive adhesive, wherein:
   the third conductive adhesive has a third geometric center, and is at least partly disposed between the first conductive seat and the integrated chip;
   the principal reference plane further has a third perpendicular projection position defined according to the third geometric center, a second reference straight line passing through the third and the first perpendicular projection positions, and a third reference straight line passing through the third and the second perpendicular projection positions;
   a second specific angle is included by the second reference straight line and the first major axis, and ranges from 0 degree to 90 degrees;
   a third specific angle is included by the third reference straight line and the first major axis, and ranges from 0 degree to 90 degrees;
   the third conductive adhesive is contiguous with or separate from the first conductive adhesive; and
   the third conductive adhesive is contiguous with or separate from the second conductive adhesive.

5. The crystal device according to claim 1, wherein:
the bearing base further includes a second conductive seat being separate from the first conductive seat;
the integrated chip includes a crystal chip being a quartz chip, a first excitation electrode, a second excitation electrode, a first extension electrode and a second extension electrode;
the crystal chip has a first corner portion being adjacent to the first conductive seat and a second corner portion being adjacent to the second conductive seat, is formed as a crystal plate, and includes a first main surface and a second main surface being opposite to the first main surface, wherein the first corner portion has a first side portion and a second side portion being adjacent to the first side portion; and
the first and the second excitation electrodes are coupled to the first and the second main surfaces respectively.

6. The crystal device according to claim 5, wherein:
the first extension electrode is extended from the first excitation electrode to the first corner portion, and includes a first edge portion and a second edge portion being in contact with the first side portion and the second side portion respectively;
the second extension electrode is extended from the second excitation electrode to the second corner portion;
the first conductive adhesive is in contact with the first conductive seat and the first edge portion; and
the second conductive adhesive is in contact with the first conductive seat and the second edge portion.

7. The crystal device according to claim 5, wherein:
the crystal device further comprises a third conductive adhesive and a fourth conductive adhesive;
the third conductive adhesive has a third geometric center, and is at least partly disposed between the second conductive seat and the second extension electrode;
the fourth conductive adhesive has a fourth geometric center, and is at least partly disposed between the second conductive seat and the second extension electrode;
the principal reference plane further has a third perpendicular projection position defined according to the third geometric center, a fourth perpendicular projection position defined according to the fourth geometric center, and a second reference straight line passing through the third and the fourth perpendicular projection positions;
a second specific angle is included by the second reference straight line and the first major axis, and ranges from 0 degree to 90 degrees.

8. A crystal device, comprising:
a bearing base including a first conductive seat;
an integrated chip including a principal reference plane facing the first conductive seat, and having a first major axis; and
a first conductive adhesive unit having a second major axis and a first aspect ratio, and at least partly disposed between the first conductive seat and the integrated chip, wherein:
the first aspect ratio ranges from 1.1 to 1.9;
the principal reference plane further has a first perpendicular projection straight line defined according to the second major axis; and
a first practical angle is included by the first perpendicular projection straight line and the first major axis, and ranges from 0 degree to 90 degrees.

9. The crystal device according to claim 8, wherein:
the bearing base further includes a second conductive seat being separate from the first conductive seat;
the integrated chip includes a crystal chip being a quartz chip, a first excitation electrode, a second excitation electrode, a first extension electrode and a second extension electrode;
the crystal chip has a first corner portion being adjacent to the first conductive seat and a second corner portion being adjacent to the second conductive seat, is formed as a crystal plate, and includes a first main surface and a second main surface being opposite to the first main surface, wherein the first corner portion has a first side portion and a second side portion being adjacent to the first side portion; and
the first and the second excitation electrodes are coupled to the first and the second main surfaces respectively.

10. The crystal device according to claim 9, wherein:
the first extension electrode is extended from the first excitation electrode to the first corner portion, and includes a first edge portion and a second edge portion being in contact with the first side portion and the second side portion respectively;
the second extension electrode is extended from the second excitation electrode to the second corner portion;
a first portion of the first conductive adhesive unit is in contact with the first conductive seat and the first edge portion; and
a second portion of the first conductive adhesive unit is in contact with the first conductive seat and the second edge portion.

11. The crystal device according to claim 9, wherein:
the crystal device is a quartz crystal resonator, and further comprises a second conductive adhesive unit;
the second conductive adhesive unit has a third major axis and a second aspect ratio, and is at least partly disposed between the second conductive seat and the second extension electrode; and
the second aspect ratio ranges from 1.1 to 1.9.

12. The crystal device according to claim 11, wherein:
the principal reference plane further has a second perpendicular projection straight line defined according to the third major axis; and
a second practical angle is included by the second perpendicular projection straight line and the first major axis, and ranges from 0 degree to 90 degrees.

13. A method for manufacturing a crystal device, comprising steps of:
providing a bearing base including a first conductive seat, a first reference target area at least partly disposed on the first conductive seat, and a second reference target area at least partly disposed on the first conductive seat, wherein the first reference target area has a first reference position, and the second reference target area has a second reference position being different from the first reference position;
making the first reference target area receive a first conductive adhesive being in a relatively low hardened state with reference to the first reference position;
making the second reference target area receive a second conductive adhesive being in the relatively low hardened state with reference to the second reference position;
providing an integrated chip including a principal reference plane having a first major axis;
disposing the integrated chip onto the first and the second conductive adhesives, wherein the principal reference plane faces the first conductive seat, and further has a first perpendicular projection position defined according to the first reference position, a second perpendicular projection position defined according to the second reference position, and a first reference straight line passing through the first and the second perpendicular projection positions, a first specific angle is included by the first reference straight line and the first major axis, and the first specific angle ranges from 0 degree to 90 degrees;

curing the first conductive adhesive in a first relatively high hardened state; and curing the second conductive adhesive in a second relatively high hardened state.

14. The method according to claim 13, wherein:
the first conductive adhesive is contiguous with or separate from the second conductive adhesive; and
the first and the second conductive adhesives respectively have a first body volume and a second body volume.

15. The method according to claim 13, wherein:
the crystal device is a quartz crystal resonator;
the first and the second conductive adhesives are merged together to form a conductive adhesive unit;
the conductive adhesive unit has a second major axis and an aspect ratio;
the aspect ratio ranges from 1.1 to 1.9;
the principal reference plane further has a perpendicular projection straight line defined according to the second major axis; and
a practical angle is included by the perpendicular projection straight line and the first major axis, and ranges from 0 degree to 90 degrees.

16. The method according to claim 13, wherein:
the bearing base further includes a third reference target area at least partly disposed on the first conductive seat, wherein the third reference target area has a third reference position;
the method further includes a step of making the third reference target area receive a third conductive adhesive being in the relatively low hardened state with reference the third reference position;
the step of disposing the integrated chip onto the first and the second conductive adhesives includes a sub-step of disposing the integrated chip onto the first, the second and the third conductive adhesives;
under a condition that the integrated chip is disposed on the first, the second and the third conductive adhesives, the principal reference plane further has a third perpendicular projection position defined according to the third reference position, a second reference straight line passing through the third and the first perpendicular projection positions, and a third reference straight line passing through the third and the second perpendicular projection positions;
a second specific angle is included by the second reference straight line and the first major axis, and ranges from 0 degree to 90 degrees;
a third specific angle is included by the third reference straight line and the first major axis, and ranges from 0 degree to 90 degrees;
the method further includes a step of curing the third conductive adhesive in a third relatively high hardened state;
the third conductive adhesive is contiguous with or separate from the first conductive adhesive; and
the third conductive adhesive is contiguous with or separate from the second conductive adhesive.

17. The method according to claim 13, wherein:
the bearing base further includes a second conductive seat being separate from the first conductive seat;
the integrated chip includes a crystal chip being a quartz chip, a first excitation electrode, a second excitation electrode, a first extension electrode and a second extension electrode;
the crystal chip has a first corner portion being adjacent to the first conductive seat and a second corner portion being adjacent to the second conductive seat, is formed as a crystal plate, and includes a first main surface and a second main surface being opposite to the first main surface, wherein the first corner portion has a first side portion and a second side portion being adjacent to the first side portion; and
the first and the second excitation electrodes are coupled to the first and the second main surfaces respectively.

18. The method according to claim 17, wherein:
the first extension electrode is extended from the first excitation electrode to the first corner portion, and includes a first edge portion being in contact with the first side portion, and a second edge portion being in contact with the second side portion;
the second extension electrode is extended from the second excitation electrode to the second corner portion;
the first conductive adhesive is in contact with the first conductive seat and the first edge portion; and
the second conductive adhesive is in contact with the first conductive seat and the second edge portion.

19. The method according to claim 17, wherein:
the bearing base further includes a third reference target area at least partly disposed on the second conductive seat, and a fourth reference target area at least partly disposed on the second conductive seat;
the first and the third reference target areas are separate from each other;
the third reference target area has a third reference position;
the fourth reference target area has a fourth reference position being different from the third reference position; and
the method further comprises steps of:
making the third reference target area receive a third conductive adhesive being in the relatively low hardened state with reference to the third reference position; and
making the fourth reference target area receive a fourth conductive adhesive being in the relatively low hardened state with reference to the fourth reference position.

20. The method according to claim 19, wherein:
the step of disposing the integrated chip onto the first and the second conductive adhesives includes a sub-step of disposing the integrated chip onto the first, the second, the third and the fourth conductive adhesives;
under a condition that the integrated chip is disposed on the first, the second, the third and the fourth conductive adhesives, the principal reference plane further has a third perpendicular projection position defined according to the third reference position, a fourth perpendicular projection position defined according to the fourth reference position, and a second reference straight line passing through the third and the fourth perpendicular projection positions, a second specific angle is included by the second reference straight line and the first major axis, and the second specific angle ranges from 0 degree to 90 degrees; and the method further comprises steps of:
- curing the third conductive adhesive in a third relatively high hardened state; and
- curing the fourth conductive adhesive in a fourth relatively high hardened state.

* * * * *